United States Patent
Yamanaka et al.

(10) Patent No.: US 11,223,158 B2
(45) Date of Patent: Jan. 11, 2022

(54) WATERPROOF ELECTRONIC COMPONENT AND METHOD FOR ASSEMBLING THE SAME

(71) Applicant: HOSIDEN CORPORATION, Osaka (JP)

(72) Inventors: Satoshi Yamanaka, Osaka (JP); Masanori Inoue, Osaka (JP)

(73) Assignee: Hosiden Corporation, Osaka (JP)

( * ) Notice: Subject to any disclaimer, the term of this patent is extended or adjusted under 35 U.S.C. 154(b) by 0 days.

(21) Appl. No.: 16/918,286

(22) Filed: Jul. 1, 2020

(65) Prior Publication Data
US 2021/0006005 A1    Jan. 7, 2021

(30) Foreign Application Priority Data

Jul. 4, 2019 (JP) .............................. JP2019-125537
Jul. 4, 2019 (JP) .............................. JP2019-125538

(51) Int. Cl.
*H05K 5/06* (2006.01)
*H01R 13/52* (2006.01)
(Continued)

(52) U.S. Cl.
CPC ......... *H01R 13/521* (2013.01); *F21V 19/003* (2013.01); *H01R 13/5202* (2013.01);
(Continued)

(58) Field of Classification Search
CPC .............. H01R 13/521; H01R 13/5202; H01R 13/5216; Y10S 439/936; F21V 19/003; H05K 5/06
See application file for complete search history.

(56) References Cited

U.S. PATENT DOCUMENTS

| 6,779,260 B1 | 8/2004 | Brandenberg et al. |
| 2006/0077643 A1* | 4/2006 | Mayuzumi ............. H05K 3/284 439/76.1 |

(Continued)

FOREIGN PATENT DOCUMENTS

| EP | 1 463 104 A2 | 9/2004 |
| EP | 3 462 820 A2 | 4/2019 |

(Continued)

OTHER PUBLICATIONS

Extended European Search Report from European Patent Application No. 20182954.6 dated Nov. 2, 2020.

*Primary Examiner* — Tho D Ta
(74) *Attorney, Agent, or Firm* — Dilworth & Barrese, LLP

(57) ABSTRACT

This disclosure provides a waterproof electronic component having good waterproofness and a method for assembling the waterproof electronic component. A repeater as a waterproof electronic component includes (i) a substrate having first through holes, (ii) a socket fixed to the substrate, (iii) a housing containing the substrate, (iv) a pin held by the housing and having a first end connected to the substrate, and (v) a sealing section with which an area surrounded by the substrate and the housing is filled, the housing including a support including a supportive wall section capable of supporting a fixation portion of the socket and a seat section having a seating surface on which the substrate is placed, the substrate being placed on the seat section, the socket being oriented in such a manner that at least a portion of an outer surface of the fixation portion is close to and faces the supportive wall section.

15 Claims, 12 Drawing Sheets

(51) Int. Cl.
*F21V 19/00* (2006.01)
*F21Y 115/10* (2016.01)

(52) U.S. Cl.
CPC ........... H01R 13/5216 (2013.01); H05K 5/06 (2013.01); *F21Y 2115/10* (2016.08)

(56) References Cited

U.S. PATENT DOCUMENTS

| | | | |
|---|---|---|---|
| 2007/0161269 A1* | 7/2007 | Sugimoto | ......... B29C 45/14065 |
| | | | 439/76.1 |
| 2013/0058044 A1 | 3/2013 | Watanabe et al. | |
| 2013/0279183 A1 | 10/2013 | Yoshida | |
| 2019/0103699 A1 | 4/2019 | Yamanaka | |

FOREIGN PATENT DOCUMENTS

| | | | | |
|---|---|---|---|---|
| JP | 2000-151123 A | 5/2000 | | |
| JP | 2012-146474 A | 8/2012 | | |
| WO | WO-2019009148 A1 * | 1/2019 | ......... | H01R 13/5216 |

* cited by examiner

WATERPROOF ELECTRONIC COMPONENT AND METHOD FOR ASSEMBLING THE SAME

CROSS REFERENCE TO RELATED APPLICATION

This application is based on and claims priority under 35 U.S.C. Section 119 to Japanese Patent Applications No. 2019-125537 and No. 2019-125538 filed on Jul. 4, 2019, the entire content of which are incorporated herein by reference.

TECHNICAL FIELD

This disclosure relates to a waterproof electronic component and a method for assembling the waterproof electronic component.

BACKGROUND ART

JP 2000-151123 A discloses an electronic circuit unit (waterproof electronic component). The electronic circuit unit includes a waterproof connector, an electronic circuit board connected to the waterproof connector, and an exterior tube. The waterproof connector includes a guide groove and terminals, and is configured to sandwich, between the terminals, the electronic circuit board as inserted in the guide groove, so that the waterproof connector and the electronic circuit board are electrically connected to each other. The electronic circuit board is covered by the exterior tube. The exterior tube is filled with a sealing resin for waterproofness.

JP 2012-146474 A discloses an LED unit (waterproof light-emitting device). The LED unit includes a light-transmitting housing, a design cover by which the housing is covered, and a circuit board on which an LED chip is mounted. The LED unit is produced by placing the circuit board in the housing, drawing an electric wire connected to the circuit board out of the housing, and providing a gasket to seal the inside of the housing for waterproofness. Light of the LED passes through the housing and then through a window of the design cover to reach a predetermined position.

SUMMARY OF INVENTION

For the waterproof electronic component disclosed in JP 2000-151123 A, it may be difficult to achieve waterproofness in the case where the connector is mounted on the electronic substrate in advance. Further, if the user routinely inserts and pulls a plug into and out of the connector, it is difficult to avoid the connector being pried. For a circuit board on which an LED is mounted as disclosed in JP 2012-146474 A, it may not be possible to simply seal the circuit to achieve waterproofness because light needs to be guided to the outside.

This disclosure has been accomplished in view of the above circumstances. It is an object of this disclosure to provide (i) a waterproof electronic component having good waterproofness and (ii) a method for assembling the waterproof electronic component.

Solution to Problem

In order to attain the above object, a waterproof electronic component according to this disclosure comprises: an electronic substrate including a contact point for electric connection; a first connector including (i) an insertion port into which a plug is inserted and out of which the plug is pulled and (ii) a fixation portion mounted on and fixed to a surface of the electronic substrate; a housing containing the electronic substrate; a terminal pin held by the housing and having a first end electrically connected to the electronic substrate via the contact point; and a sealing section including a resin with which an area surrounded by the electronic substrate and the housing is filled, wherein the insertion port is present outside a peripheral edge of the electronic substrate and faces outwardly in such a manner that a direction of the insertion and pulling is along a board surface of the electronic substrate, the housing includes: a seat section having a seating surface on which the electronic substrate is placed; and a support including a supportive wall section capable of supporting the fixation portion of the first connector, the electronic substrate is placed on the seat section in a state where the surface of the electronic substrate faces the seating surface, and the first connector is oriented in such a manner that at least a portion of an outer surface of the fixation portion is close to and faces the supportive wall section.

With the above arrangement, for assembly of the waterproof electronic component, placing the electronic substrate on the seat section while keeping the terminal pin of the electronic substrate in electric connection to the contact point allows the electronic substrate to be contained in the housing while being positioned. When the electronic substrate is placed in the housing, the first connector is apart from the supportive wall section and does not influence the positioning. The contact point for electric connection to the electronic substrate is, for example, a through hole or a land.

With the above arrangement, when the electronic substrate has been placed on the seat section, the first connector is in a state where the fixation portion has an outer surface at least a portion of which is close to and faces the supportive wall section. This allows the supportive wall section to be capable of supporting at least a portion of the outer surface of the first connector. Thus, if the first connector has, when the plug is inserted or pulled, received a prying force in such a direction as to become close to the supportive wall section and has become, for example, deformed slightly, the first connector comes into contact with and is supported by the supportive wall section, and is prevented from becoming deformed further. This allows the first connector to be tolerant to a prying force toward the side on which the first connector is supported by the supportive wall section. The above arrangement further includes a sealing section made of a sealer (resin) with which the area surrounded by the electronic substrate and the housing is filled. This effectively prevents entry of water from around the connector into the area surrounded by the electronic substrate and the housing. The above arrangement, as a result, provides a waterproof electronic component tolerant to a prying force and having waterproofness.

A waterproof electronic component according to another embodiment of this disclosure comprises: a design panel including a plate section having an open hole in which the first connector is fitted, the design panel having a periphery partially covered by the housing, wherein the support includes a sealing wall in a direction crossing the seating surface, the sealing wall extending in such a manner as to partially cover the outer surface of the fixation portion of the first connector, and the design panel is partially embedded in the sealing section and is fixed to the housing in a state where the plate section has a plate surface facing a wall surface of the sealing wall.

With the above arrangement, the insertion port of the first connector is positioned outside the peripheral edge of the electronic substrate, and the supportive wall section is capable of supporting the fixation portion of the first connector. Thus, the design panel allows that portion of the first connector which is on the side of the insertion port to be inserted in the open hole. When that portion of the first connector which is on the side of the insertion port has been inserted in the open hole of the design panel in the state where the electronic substrate is placed on the seat section and contained in the housing, the plate section of the design panel has a plate surface facing a wall surface of the sealing wall. With the above arrangement, a portion of the design panel (for example, a peripheral portion of the plate section) is embedded in the sealing section and is fixed to the housing in the state where the plate surface faces the wall surface as described above. As a result, the area surrounded by the electronic substrate, the housing, and the design panel becomes filled with a sealer (resin) for formation of the sealing section. This effectively prevents, in particular, entry of water from around the design panel and the connector into the area surrounded by the electronic substrate, the housing, and the design panel.

With the above arrangement, the design panel is only partially embedded in the sealing section. This allows a major part of the design of the design panel to be seen from outside and maintains the good appearance around the connector. The above arrangement, as a result, provides a waterproof electronic component having a good appearance around the connector, tolerant to a prying force, and having waterproofness.

A waterproof electronic component according to another embodiment of this disclosure is arranged such that the supportive wall section includes two first supportive wall sections close to and facing two respective side end faces included in the outer surface of the fixation portion, the side end faces being parallel to the direction of the insertion and pulling and perpendicular to the board surface of the electronic substrate.

The above arrangement allows the first connector to be more tolerant to a prying force applied in a direction crossing the direction of the insertion and pulling for the first connector and along the board surfaces of the electronic substrate when, for instance, a plug is inserted or pulled.

A waterproof electronic component according to another embodiment of this disclosure is arranged such that the supportive wall section includes a second supportive wall section close to and facing a back end surface included in the outer surface of the fixation portion, the back end surface being perpendicular to the direction of the insertion and pulling and opposite to the insertion port.

The above arrangement allows the first connector to be more tolerant to a force applied in the direction of the insertion and pulling for the first connector when a plug is inserted.

A waterproof electronic component according to another embodiment of this disclosure is arranged such that the supportive wall section includes a third supportive wall section close to and facing an opposite surface included in the outer surface of the fixation portion, the opposite surface being parallel to the direction of the insertion and pulling and opposite to that surface of the fixation portion which faces the electronic substrate.

The above arrangement allows the first connector to be more tolerant to a prying force applied in a direction apart from the electronic substrate when, for instance, a plug is inserted or pulled.

A waterproof electronic component according to another embodiment of this disclosure is arranged such that the design panel and the housing are connected with each other in a snap-fit manner.

The above arrangement allows the first connector to be fitted in the open hole of the design panel, and also allows the design panel and the housing to become connected with each other as a result of a simple operation based on a snap-fit mechanism.

A waterproof electronic component according to another embodiment of this disclosure is arranged such that the electronic substrate is entirely contained in a space surrounded by the housing, the design panel, and the sealing section.

The above arrangement allows the electronic substrate to be entirely embedded in the sealing section for ensured waterproofness.

A waterproof electronic component according to another embodiment of this disclosure is arranged such that the housing includes: a first housing wall along the electronic substrate; and a second housing wall standing on a peripheral portion of the first housing wall, wherein the seat section is in a form of a pillar that is apart from the second housing wall and that protrudes from a surface of the first housing wall in a direction in which the second housing wall stands, and the seating surface is an end surface of the seat section in the form of the pillar.

With the above arrangement, the housing contains the electronic substrate in a space surrounded by the first housing wall and the second housing wall. The seat section of the housing protrudes in the shape of a pillar from the first housing wall along the second housing wall, and has an upper end surface on which the electronic substrate is placed. Since the seat section is apart from the second housing wall, a sealer, when injected, flows smoothly through a space between the seat section and the second housing wall. This allows a sealer to be provided appropriately in a space between the seat section and the second housing wall, and allows the electronic substrate to be entirely covered and reliably sealed by the sealer.

A waterproof electronic component according to another embodiment of this disclosure comprises: a second connector including (i) a frame body capable of becoming fitted with an external connector and (ii) an external terminal, which is a second end of the terminal pin, present in a space surrounded by the frame body, wherein the terminal pin has an intermediate portion fixed to the housing through insert molding, and the frame body is integrated with the housing.

The above arrangement allows the waterproof electronic component to become connected via the second connector to a plug or electronic component other than the plug inserted through the first connector. With the above arrangement, the terminal pin is fixed to the housing through insert molding with a second end thereof to serve as an external terminal. This allows the terminal pin to be fixed firmly to the housing. Forming the frame body of the second connector integrally with the housing allows the strength of the second connector to be maintained.

An embodiment of a method for assembling the waterproof electronic component comprises: placing the electronic substrate, on which the first connector is mounted and to which the first connector is fixed, into the housing while keeping the first end of the terminal pin, fixed to the housing through insert molding, in electric connection with the contact point; then fitting the first connector into the open hole of the design panel such that the design panel and the housing become connected with each other in a snap-fit manner; and then injecting the sealer into an area surrounded by the electronic substrate, the housing, and the design panel to form the sealing section.

The above arrangement allows efficient assembly of the waterproof electronic component, which produces the working effects described above.

Another embodiment is arranged such that the electronic substrate is embedded in the sealer for the formation of the sealing section.

The above arrangement allows the electronic substrate to be entirely embedded in the sealing section for ensured waterproofness.

A waterproof electronic component according to another embodiment of this disclosure comprises: an electronic substrate including a contact point for electric connection; a housing including a first housing wall along the electronic substrate and containing the electronic substrate; a light-emitting diode present between the electronic substrate and the housing and including (i) a light-emitting section including a light-emitting element and (ii) a terminal pin protruding from the light-emitting section; a light-guiding seat section configured to guide light of the light-emitting section to outside of the housing; and a sealing section including a resin with which an area surrounded by the electronic substrate and the housing is filled, wherein the first housing wall includes: a seat section having a seating surface on which the electronic substrate is placed; and a window section in which the light-guiding seat section is fitted and which has an open hole, the light-emitting diode is oriented such that the light-emitting section is supported by the light-guiding seat section in a state where a first end of the terminal pin protrudes in a direction crossing the seating surface, the electronic substrate is present on the seat section in a state where the first end of the terminal pin is connected to the contact point, the light-guiding seat section includes: a light-guiding seat section main body having a depression in which the light-emitting section is fitted and which supports the light-emitting section; a plate surface section present at a peripheral portion of the light-guiding seat section main body and in surface contact with an area around the open hole; and a contact section protruding from the light-guiding seat section main body in a direction crossing the seating surface and present in contact with the electronic substrate, and the light-guiding seat section is sandwiched between and held by the first housing wall and the electronic substrate by means of the plate surface section and the contact section.

With the above arrangement, for assembly of the waterproof electronic component, placing the electronic substrate on the seat section while keeping the terminal pin of the electronic substrate in electric connection to the contact point allows the electronic substrate to be contained in the housing while being positioned. The contact point for electric connection to the electronic substrate is, for example, a through hole or a land.

With the above arrangement, the sealing section can be formed by, for example, sealing (filling) the area surrounded by the electronic substrate and the housing with resin (sealer) through, for example, a hot melt process or potting process. The above arrangement also allows the electronic substrate, the housing, the LED, and the light-guiding seat section to be sealed with the sealer and fixed in position.

The above arrangement allows light emitted by the LED in a space surrounded by the housing and sealed with the sealer (sealing section) to be guided by the light-guiding seat section through the window section to the outside of the housing.

The above arrangement allows the light-guiding seat section to be sandwiched between and tentatively fixed by the first housing wall and the electronic substrate before the electronic substrate, the housing, the LED, and the light-guiding seat section are sealed with the sealer and fixed in position. This allows the light-guiding seat section and the first housing wall to have a fixed positional relationship in advance when the light-guiding seat section and the first housing wall are later sealed with the sealer for formation of the sealing section. This increases the accuracy in the fixation by the sealing operation.

The above arrangement causes the plate surface section to be in surface contact with the area around the open hole in the first housing wall. This prevents leakage of the sealer during the sealing operation, and also allows for increased waterproofness resulting from the sealing operation.

A waterproof electronic component according to another embodiment of this disclosure is arranged such that the light-guiding seat section further includes an exposure portion fitted in the open hole and exposed to the outside of the housing, and the plate surface section is in a form of a step section extending outwardly radially from a periphery of the exposure portion.

With the above arrangement, the exposure portion is a projection capable of becoming fitted in the open hole. Fitting the exposure portion in the open hole allows the light-guiding seat section and the first housing wall to have a positional relationship tolerant in a direction crossing the direction in which the open hole extends, and also allows light of the LED to be guided through the exposure portion to the outside of the housing. With the above arrangement, for instance, the step section along the circumference of the exposure portion has a surface portion that serves as a plate surface section and that is in surface contact with the inner surface of the first housing wall. Fitting the exposure portion in the open hole in the above surface contact state allows the light-guiding seat section and the first housing wall to have a positional relationship tolerant in the direction crossing the direction in which the open hole extends. This reliably prevents leakage of the sealer during the sealing operation, and also allows for sufficiently increased waterproofness resulting from the sealing operation.

A waterproof electronic component according to another embodiment of this disclosure is arranged such that the contact section includes a plurality of pillar sections each protruding from a position along a periphery of the depression, and the plurality of pillar sections are arranged in a ring-shaped pattern around the periphery of the depression.

The above arrangement allows the sealer to flow into a space between the plurality of pillar sections as the contact section, and thereby allows for sealing with no void around the light-guiding seat section. The above arrangement also allows the sealer to flow smoothly into the depression, and thereby allows the LED to be sealed reliably.

A waterproof electronic component according to another embodiment of this disclosure is arranged such that the housing includes a second housing wall standing on a peripheral portion of the first housing wall, and the contact section is in a form of a pillar that is apart from the second housing wall and that protrudes in a direction in which the second housing wall stands.

With the above arrangement, the sealing section seals at least the area surrounded by the electronic substrate, the first housing wall, and the second housing wall. While the contact section is in the form of pillars extending along the second housing wall, the sealer is allowed to flow into a space between the contact section and the second housing wall. This allows for sealing with no void around the light-guiding seat section.

Another embodiment of a method for assembling the waterproof electronic component comprises: fitting the light-guiding seat section into the window section and allowing the light-guiding seat section to support the light-emitting section of the light-emitting diode such that the first end of the terminal pin protrudes in the direction crossing the seating surface; then placing the electronic substrate into the housing while keeping the first end of the terminal pin in connection to the contact point, and then injecting a sealer into the area surrounded by the electronic substrate and the housing to form the sealing section.

The above arrangement allows efficient assembly of the waterproof electronic component, which produces the working effects described above.

Another embodiment is arranged such that the electronic substrate is embedded in the sealer for the formation of the sealing section.

The above arrangement allows the electronic substrate to be entirely embedded in the sealing section for ensured waterproofness.

DESCRIPTION OF EMBODIMENTS

Figure 1:
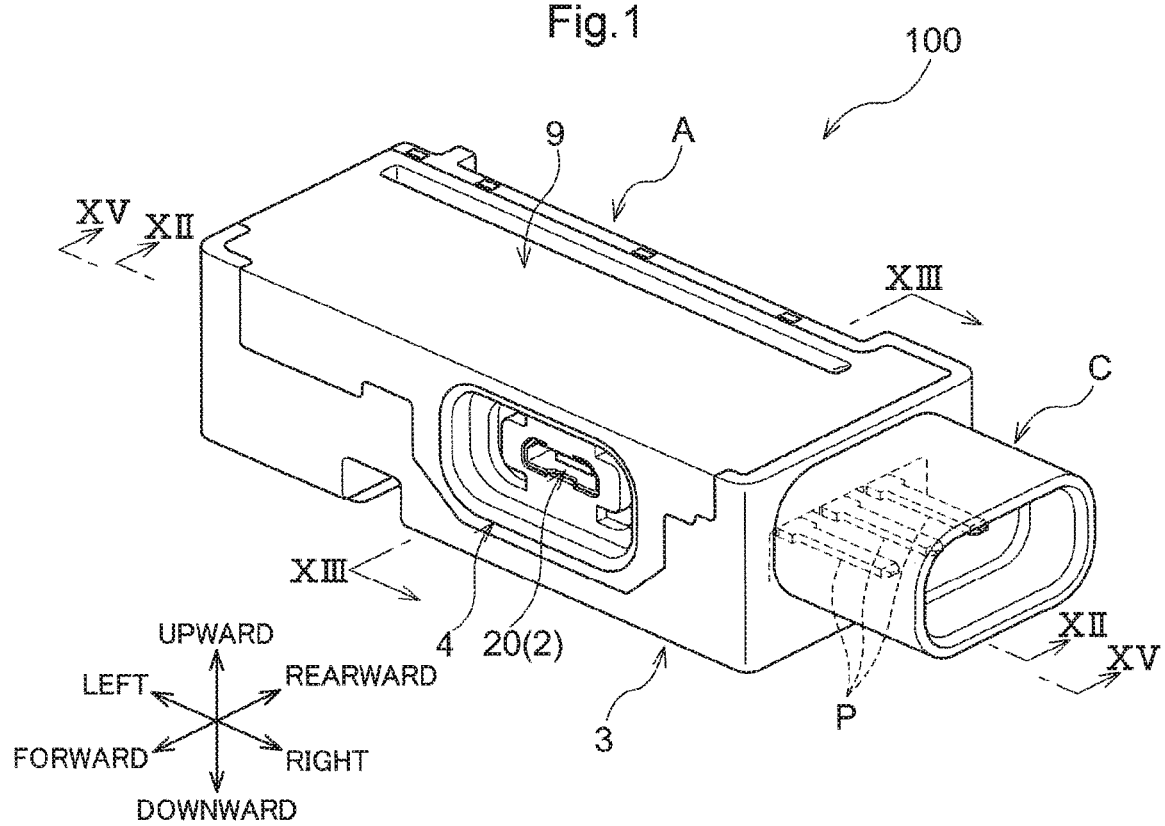
FIG. 1 is a perspective view of a repeater as viewed obliquely from a front, upper right position.

The description below deals with a waterproof electronic component and a method for assembling the waterproof electronic component in accordance with an embodiment of this disclosure with reference to drawings.
[Schematic Configuration of Repeater]
FIGS. 1 and 2 each illustrate, as an example waterproof electronic component in accordance with the present embodiment, a repeater 100 including an LED mounted therein, the repeater 100 being configured to (i) convert power from an emergency portable power source into an electric current having a predetermined voltage and (ii) supply the electric current to a storage battery of a work machine for outdoor work or the like. FIG. 3 is an exploded perspective view of the repeater 100.

The repeater 100, as illustrated in FIG. 3, includes (i) a first connector (hereinafter referred to simply as "socket 2"), (ii) a shell-shaped light-emitting diode element (hereinafter referred to simply as "LED 5"), (iii) an electronic substrate (hereinafter referred to simply as "substrate 1") on which the socket 2 and the LED 5 are mounted, (iv) a housing 3 containing the substrate 1 and including a window section W having a window hole 39 (see FIG. 5; "second through hole"), (v) a plurality of (three) terminal pins (hereinafter referred to simply as "pins F") fixed to (held by) the housing 3 through insert molding, (vi) a second connector (hereinafter referred to simply as "plug C") integrated with the housing 3, (vii) a design panel (hereinafter referred to simply as "panel 4") separating the internal space of the housing 3 and its external space from each other in a state where an insertion port 20 of the socket 2 is exposed to the outside of the housing 3, (viii) a light-guiding seat section 6 configured to guide light of the LED 5 from the internal space through the window section W of the housing 3 to the external space and separating the internal space and the external space from each other at the window section W, and (ix) a sealing section 9 embedding and sealing the substrate 1, the LED 5, the light-guiding seat section 6, and the panel 4 as contained or fitted in the housing 3. The sealing section 9 is formed by, for example, melting a resin sealer, pouring the molten sealer into the housing 3, and curing the sealer. In actuality, the sealing section 9 cannot, in the cured state illustrated in FIG. 3, be separated from the rest of the repeater 100 as an independent member.

Figure 2:
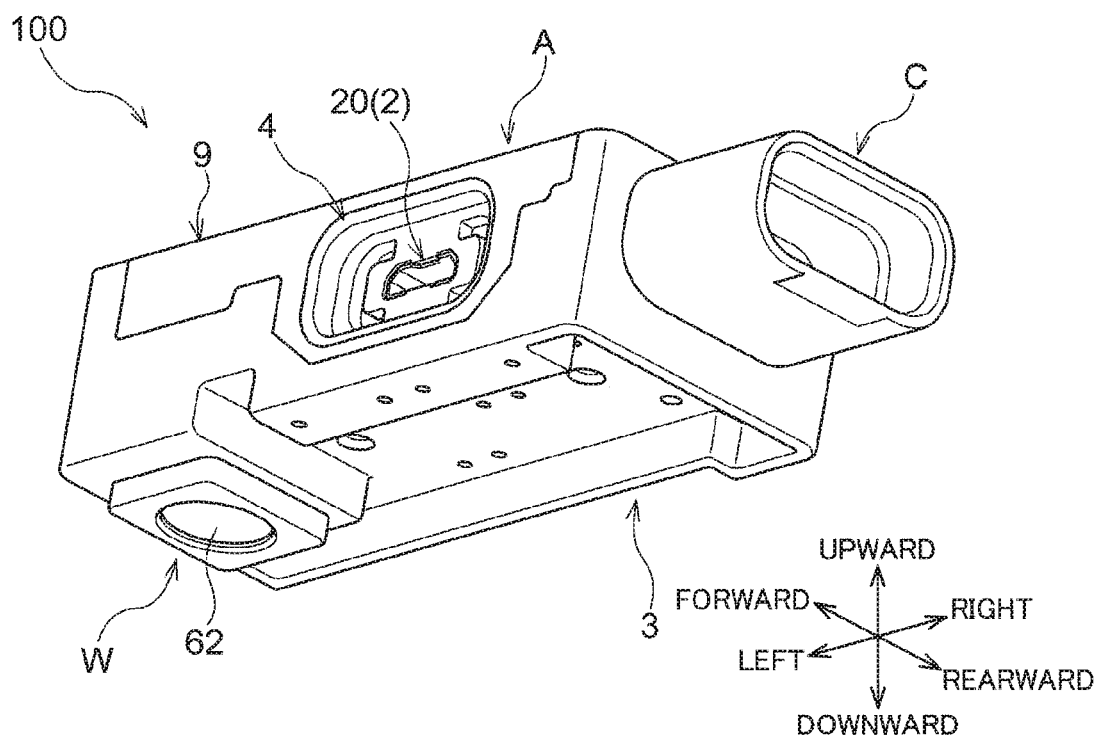
FIG. 2 is a perspective view of a repeater as viewed obliquely from a front, lower right position.
Figure 3:
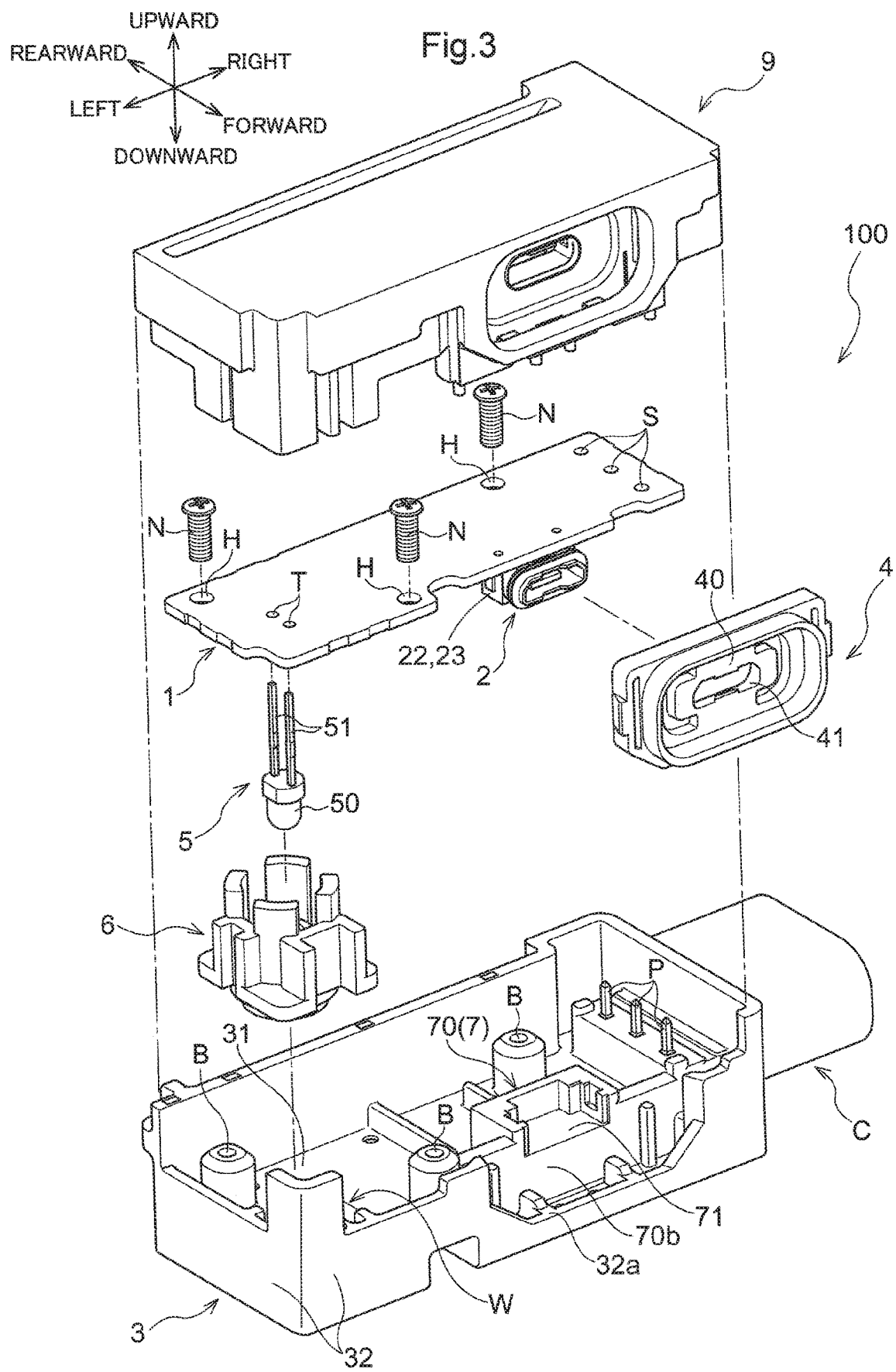
FIG. 3 is an exploded perspective view of a repeater.

The repeater 100, as illustrated in FIGS. 1 and 2, includes a cuboid main body A made up of the housing 3 and the sealing section 9 sealing the housing 3, the main body A having a side surface at which the insertion port 20 of the socket 2 is exposed and another side surface adjacent to the above side surface at which the plug C is present. The repeater 100 is also configured as illustrated in FIG. 2 such that the housing 3 has a window section W at another side surface adjacent to both the side surface at which the insertion port 20 is exposed and the side surface at which the plug C is present.

The description below uses (i) words such as "front" and "forward" to refer to a one-way direction faced by that side surface of the cuboid main body A of the repeater 100 illustrated in FIGS. 1 and 2 at which the insertion port 20 is exposed, (ii) words such as "back" and "backward" to refer to a one-way direction opposite to the above direction, and (iii) the simple term "front-back direction" to refer to a two-way direction of forward and backward. The description below uses (i) the word "right" to refer to a one-way direction faced by that side surface of the main body A at which the plug C is present, (ii) the word "left" to refer to a one-way direction opposite to the above direction, and (iii) the simple term "left-right direction" to refer to a two-way direction of right and left. The description below uses (i) words such as "down" and "below" to refer to a one-way direction in which the window section W is present on the main body A, (ii) words such as "up" and "above" to refer to a one-way direction opposite to the above direction, and (iii) the simple term "up-down direction" to refer to a two-way direction of up and down.

[Configurations of Individual Sections]

Figure 4:
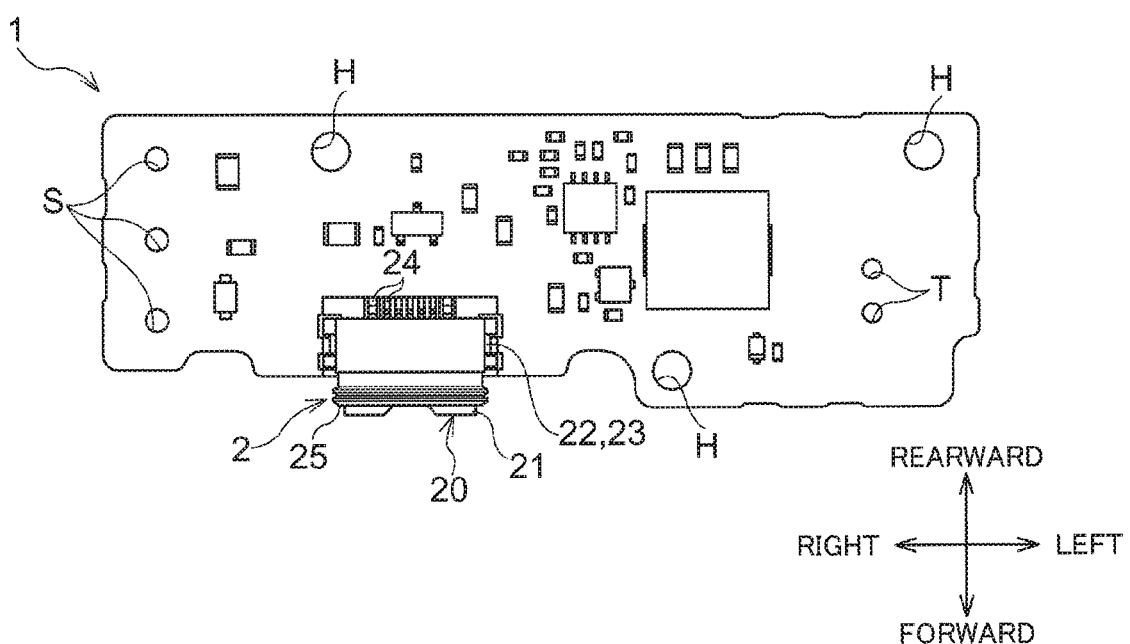
FIG. 4 is a bottom view of an electronic substrate.

The substrate 1 is a circuit board such as a rectangular printed circuit board as illustrated in FIG. 4. The substrate 1 has a lower surface on which the socket 2 and various electronic components are mounted. The substrate 1 has, as open holes in the board surfaces of the substrate 1, (i) for example, a set of three first through holes S, (ii) for example, a pair of second through holes T, and (iii) for example, three screw insertion holes H.

The first through holes S and the second through holes T are electrode structures as contact points on the side of the substrate 1 which contact points serve to electrically connect a wiring pattern on the substrate 1 to, for example, electronic components mounted on the substrate 1 and external terminals. The first through holes S and the second through holes T each include (i) an open hole present through the board surfaces of the substrate 1, the open hole having an inner wall provided with an electrode, and (ii) a land (not shown in the drawings) as an electrode present in a region on a surface of the substrate 1 which region surrounds the open hole.

The first through holes S are present at a right end of the substrate 1 in its longitudinal direction (that is, the left-right direction for the present embodiment; hereinafter referred to simply as "left-right direction"). The second through holes T are present at a left end of the substrate 1 in the left-right direction.

As illustrated in FIG. 3, the first through holes S receive pins P (described later) as inserted therein for electric connection, the second through holes T receive LED pins 51 (described later) as inserted therein for electric connection, and the screw insertion holes H receive screws N (described later) as inserted therein.

The socket 2 is, as illustrated in FIG. 4, a fitting fixedly mounted on the substrate 1 for connection of power and/or a signal line (so-called receptacle). The socket 2 for the present embodiment is a so-called female receptacle or socket insert. The socket 2 is configured such that its main body has an end opposite to the insertion port 20 which end is fixed to the substrate 1. The description below uses the term "front end 21" to refer to that side portion of the socket 2 on which the insertion port 20 is present and the term "fixation portion 22" to refer to that side portion of the socket 2 which is opposite to the insertion port 20 and which is fixed to the substrate 1. Into and out of the socket 2, an external connector (not shown in the drawings) electrically connected to an external electric part is inserted and pulled. The insertion port 20 is a hole into and out of which such an external connector is inserted and pulled.

The socket 2 is fixed to the substrate 1 in such an orientation that the direction of the insertion and pulling is along the board surfaces of the substrate 1. The socket 2 includes terminals 24 soldered or otherwise fixed to the substrate 1. The socket 2 also includes a band 23 in the form of, for example, a thin metal plate which band 23 is soldered or otherwise fixed to the substrate 1 in such a manner as to press the periphery of the fixation portion 22 against the substrate 1. The band 23 extends in a direction that crosses the direction of the insertion and pulling for the socket 2. The band 23 has opposite ends in its extending direction which ends are fixed to the substrate 1. The band 23 is a so-called hold-down for the socket 2. With the socket 2 fixed by the band 23, the band 23 has a rectangular cross section as viewed in the direction of the insertion and pulling for the socket 2. In other words, the fixation portion 22 (band 23) has (i) left and right side surfaces that extend perpendicularly to the substrate 1 and along the direction of the insertion and pulling and (ii) a lower surface of the fixation portion 22 (that is, a surface opposite to that surface of the fixation portion 22 which faces the substrate 1) which lower surface extends parallel to the substrate 1. The description below may use (i) words such as "horizontal" for convenience to refer to a state of being parallel to the substrate 1 and (ii) the term "horizontal plane" to refer to a plane parallel to the substrate 1.

The present embodiment is arranged such that the socket 2 is fixed in such an orientation that the direction of the insertion and pulling for the socket 2 is along the front-back direction. The socket 2 is fixed such that the fixation portion 22 is fixed to a side portion of the substrate 1 in the left-right direction (that is, a front side portion of the substrate 1 in the front-back direction), that the front end 21 (insertion port 20) protrudes from the peripheral edge of the substrate 1, and that the direction of the insertion and pulling is along the substrate 1 and crosses the left-right direction of the substrate 1. The socket 2 includes a ring-shaped gasket 25 fitted around the front end 21. The gasket 25 is in hermetic contact with the outer surface of the front end 21. This prevents passage of water between the gasket 25 and the outer surface of the front end 21 (that is, entry of water from the outside).

Figure 5:
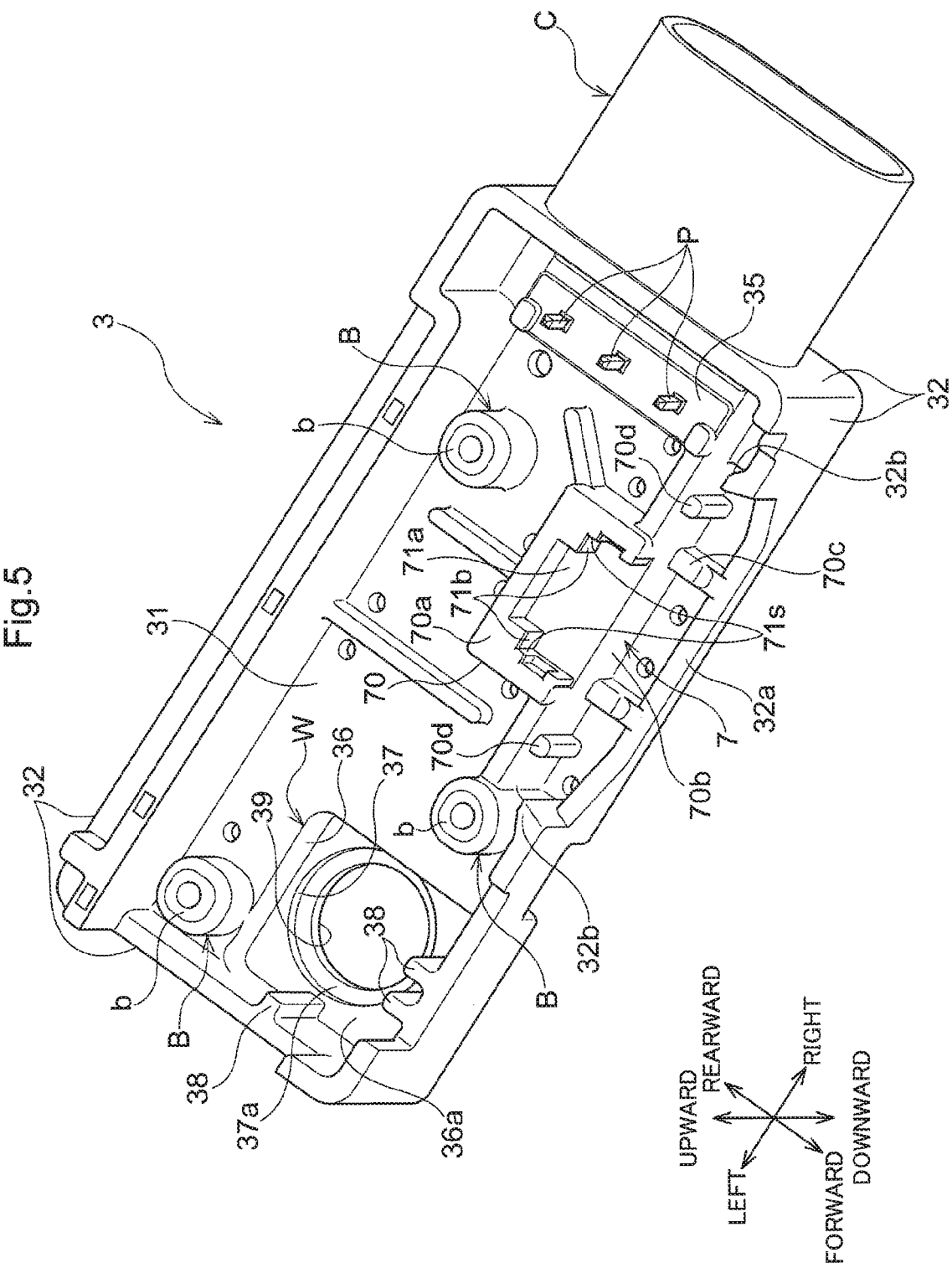
FIG. 5 is a perspective view of a housing as viewed obliquely from a front, upper position.

The housing 3 is, as illustrated in FIG. 5, a main body part of the repeater 100 which main body part receives and contains the substrate 1 as it is oriented such that the surface on which the socket 2 is mounted faces downwardly. The housing 3 is made of, for example, resin. The housing 3 includes a first housing wall 31 as a bottom plate of the housing 3 and second housing walls 32 that surround an internal region of the first housing wall 31. The housing 3 contains the substrate 1 in an inside region surrounded by the first housing wall 31 and the second housing walls 32. The housing 3 is provided with pins P formed through insert molding. The pins P each have a portion (intermediate portion) embedded in the housing 3. The pins P, each of which has a portion embedded in the housing 3, are fixed to (held by) the housing 3.

In the state where the substrate 1 is contained in the housing 3, the first housing wall 31 is oriented along the substrate 1. The first housing wall 31 for the present embodiment is parallel to the substrate 1 in the above state. The first housing wall 31 includes (i) three bosses B each standing on (that is, protruding upwardly in the up-down direction from) the upper surface of the first housing wall 31 and serving as a seat on which the substrate 1 is placed, (ii) a support 7 supporting the socket 2 when the substrate 1 is contained in the housing 3, (iii) a pin mount 35 holding the pins P in the state where a first end of each pin P protrudes in the inside region of the housing 3 and supporting the substrate 1, and (iv) a window section W in which the light-guiding seat section 6 is fitted.

The second housing walls 32 are integrated with the first housing wall 31. The second housing walls 32 stand at (that is, protrude upwardly in the up-down direction from) a peripheral portion of the first housing wall 31 (for the present embodiment, the peripheral edge). The second housing walls 32 surround the internal region of the first housing wall 31 on the four sides, that is, on the front, back, left, and right sides. The right second housing wall 32 has an outside surface (that is, a surface facing rightward) provided with the plug C. The front second housing wall 32 has a cutout section 32a in the form of a downward depression. The cutout section 32a has left and right side portions each having a housing-side hook 32b. The front and left second housing walls 32, which are adjacent to each other at the front-left corner of the housing 3, include a plurality of ribs 38 protruding into the internal region of the housing 3 and present in the up-down direction. The ribs 38 support the substrate 1.

The bosses B are each in the shape of a circular column, and each have an upper end (extending end surface) serving as a seating surface b on which the substrate 1 is placed. The bosses B each have a screw hole extending downwardly from the seating surface b. The seating surface b is along a horizontal plane, and is a horizontal plane for the present embodiment. The bosses B are apart from the second housing walls 32.

The pin mount 35 is shaped as a leftward bulge of the inner surface (that is, the surface facing leftward) of the right second housing wall 32, and is integrated with the first housing wall 31 and the second housing walls 32. The pin mount 35 has a height equal to that of each boss B. The pin mount 35 is provided with three pins P protruding upwardly from the upper surface of the pin mount 35.

The support 7 is a supportive seat supporting the socket 2 in such a manner as to surround the periphery of the socket 2. The support 7 includes (i) a main body 70 of the supportive seat which main body 70 is an upward bulge of the first housing wall 31 and (ii) a supportive depression 71 at the upper surface of the main body 70 which supportive depression 71 serves as a supportive wall section for the socket 2. The main body 70 has a front side surface serving as a sealing wall 70b facing forwardly and having a flat surface. The support 7 is present to the left of the pin mount 35. The main body 70 has a height smaller than that of each boss B. The upper surface 70a of the main body 70 is along the horizontal plane, and is lower in position than the seating surface b of each boss B. When the substrate 1 is contained in the housing 3, the upper surface 70a is close to and faces the substrate 1, but is not in contact therewith.

The supportive depression 71 coincides with the actual cutout of the cutout section 32a (where the second housing wall 32 is absent) as viewed in the front-back direction. When the substrate 1 is contained in the housing 3, the fixation portion 22 and the band 23 of the socket 2 are fitted in the supportive depression 71 loosely (that is, with a gap therebetween). The supportive depression 71 has a surface close to but apart from the respective outer surfaces of the fixation portion 22 and the band 23. In the case where a prying force has been applied to the socket 2, the surface of the supportive depression 71 can support the socket 2 as a supportive wall section.

The surface (supportive wall section) of the supportive depression 71 includes (i) first supportive wall sections 71s (that is, the left and right side walls of the supportive depression 71), (ii) a second supportive wall section 71b (that is, the back wall of the supportive depression 71), and (iii) a third supportive wall section 71a (that is, the lower wall of the supportive depression 71).

The first supportive wall sections 71s are close to and face the left and right side surfaces (which are an example of the "two respective side end faces") of the band 23. The first supportive wall sections 71s are capable of supporting the socket 2 in the left-right direction (that is, on its left and right side surfaces). The second supportive wall section 71b is close to and faces the back end of the fixation portion 22 or the band 23. The second supportive wall section 71b is capable of supporting the socket 2 forwardly in the front-back direction on its back end surface. The third supportive wall section 71a is close to and faces the lower surface of the band 23. The third supportive wall section 71a is capable of supporting the socket 2 upwardly on its lower surface.

The second supportive wall section 71b for the present embodiment has a backward hollow in which the terminals 24 of the socket 2 are contained. The first supportive wall sections 71s for the present embodiment have hollows in the left and right outward directions in which hollows those portions of the band 23 by which the band 23 is fixed to the substrate 1 are contained.

The sealing wall 70b is apart from the front second housing wall 32 in the backward direction. The sealing wall 70b for the present embodiment is parallel to the front second housing wall 32. The sealing wall 70b extends around the periphery of the socket 2 except for its upper surface (that is, the surface facing the substrate 1).

The sealing wall 70b is provided with ribs 70d protruding forwardly from the front surface of the sealing wall 70b and present in the up-down direction.

Between the sealing wall 70b and the front second housing wall 32, there are a pair of ribs 70c present in the front-back direction and standing on (that is, protruding upwardly in the up-down direction from) the first housing wall 31.

The window section W has a window hole 39 through the first housing wall 31 in the up-down direction. The window section W is a structural section of the first housing wall 31 which structural section serves as a fitting seat on which the light-guiding seat section 6 is fitted. The window section W includes (i) a first depression 36 present on the inner surface (upper surface) of the first housing wall 31 in the downward direction, (ii) a second depression 37 present on a bottom surface 36a of the first depression 36 in the downward direction, and (iii) a window hole 39 through a bottom surface 37a of the second depression 37 in the up-down direction.

The first depression 36 is present in the first housing wall 31 and adjacent to the front-left corner of the housing 3. The first depression 36 is a hollow having a rectangular cross section as viewed in the up-down direction. The bottom surface 36a of the first depression 36 is along the horizontal plane, and is a horizontal plane for the present embodiment. As described later, the first depression 36 receives the light-guiding seat section 6 as fitted therein (see FIG. 3) so that the bottom surface 36a is in surface contact with the light-guiding seat section 6.

The second depression 37 is present close to the center of the first depression 36 and is apart from those walls of the first depression 36 which extend in the up-down direction. The second depression 37 is a hollow having a circular cross section as viewed in the up-down direction. The bottom surface 37a of the second depression 37 is along the horizontal plane, and is a horizontal plane for the present embodiment. As described later, the second depression 37 receives the light-guiding seat section 6 as fitted therein (see FIG. 3) so that the bottom surface 37a is in surface contact with the light-guiding seat section 6.

The window hole 39 is a linear open hole having a circular cross section as viewed in the up-down direction. As described later, the window hole 39 receives the light-guiding seat section 6 (see FIG. 3) as fitted therein.

The plug C is a frame body capable of being fitted with an external connector (socket). The plug C is integrated with the housing 3. The plug C is in the form of a cylinder including a cylinder wall protruding from the right second housing wall 32 of the housing 3 in the left-right direction. The cylindrical plug C has an inside space in which a second end of each of the three pins P as external terminals is exposed (see FIG. 2).

Figure 6:
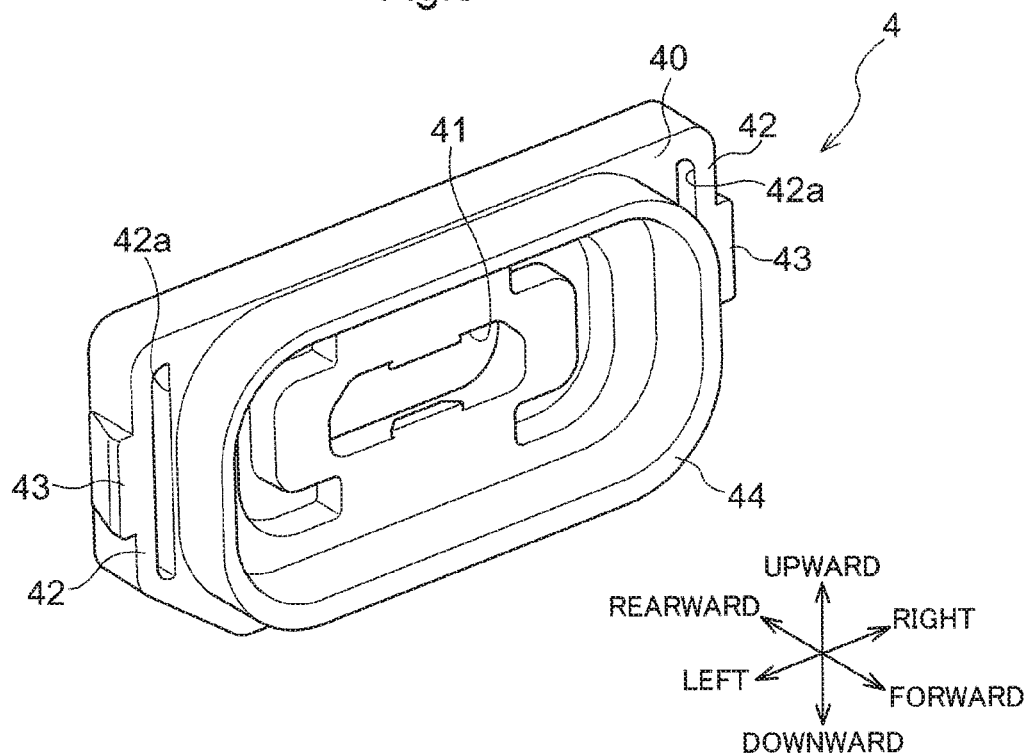
FIG. 6 is a perspective view of a design panel as viewed obliquely from a front, upper position.
Figure 7:
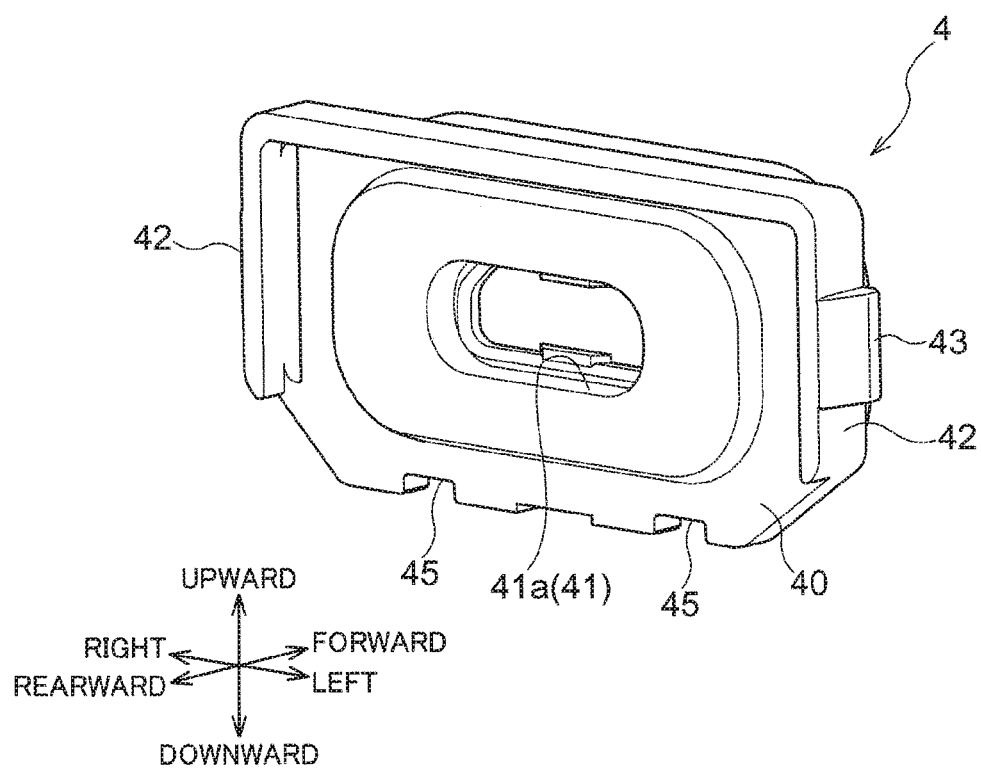
FIG. 7 is a perspective view of a design panel as viewed obliquely from a back, upper position.

The panel 4 is, as illustrated in FIGS. 6 and 7, a decorative plate that allows the insertion port 20 (see FIG. 1) of the socket 2 to be exposed to the outside and that provides a predetermined design around the insertion port 20 exposed to the outside to impart visual recognizability and aesthetics. The panel 4 includes (i) a plate section 40 having an open hole 41 (first open hole) in which the socket 2 is fitted, (ii) an outer frame 44 protruding from the front surface of the plate section 40 in the shape of a cylinder present around the open hole 41, (iii) plate spring sections 42 provided at left and right ends of the plate section 40, and (iv) panel-side hooks 43 present on the plate spring sections 42.

The plate section 40 is in the shape of a rectangular plate as viewed in the front-back direction. The plate section 40 has lower left and lower right corners that are chamfered, for example. The plate section 40 has a lower end with a pair of grooves 45 (see FIG. 7) each in the shape of a cutout in the front-back direction. The plate section 40 has slits 42a that are located slightly inwardly of the left and right ends, that extend in the up-down direction, and that are present through the plate section 40 in the front-back direction. The slits 42a allow the left and right ends of the plate section 40 to be deformed inwardly in the left-right direction as the plate spring sections 42. The plate spring sections 42 are provided with panel-side hooks 43 on the outer left and outer right sides.

The panel-side hooks 43 coincide with the housing-side hooks 32b as viewed in the front-back direction when the panel 4 is to be attached to the substrate 1 and the housing 3. The panel-side hooks 43 engage with the housing-side hooks 32b of the housing 3 in, for example, a snap-fit manner when the panel 4 is pressed and attached to the socket 2 and the housing 3 such that the socket 2 is fitted into the open hole 41.

The present embodiment is arranged such that when the panel 4 is to be attached to the substrate 1 and the housing 3, bringing the panel-side hooks 43 into contact with the housing-side hooks 32b from the front side and causing the panel-side hooks 43 to urge the housing-side hooks 32b causes the plate spring sections 42 to be deformed inwardly in the left-right direction by an amount corresponding to each slit 42a. This allows the panel-side hooks 43 to pass backwardly through a space inward of the housing-side hooks 32b in the left-right direction. When the panel-side hooks 43 have been moved backwardly past the housing-side hooks 32b, the plate spring sections 42 become released from the urge, so that the panel-side hooks 43 coincide again with the housing-side hooks 32b as viewed in the front-back direction. This causes the panel 4 to be locked (hereinafter referred to also as "locked state") between the sealing wall 70b and the front second housing wall 32 of the housing 3 in the state where the plate section 40 of the panel 4 has a plate surface facing the sealing wall 70b. The panel 4 is prevented from being moved in the left-right direction or the front-back direction by the socket 2 fitted in the open hole 41. The panel 4, which has a back surface in contact with the ribs 70d, is prevented from being moved backwardly as well.

When the panel 4 is in the locked state, the outer frame 44 has a front end flush with the front surface of the front second housing wall 32. The open hole 41 has a back hole portion as a diameter-expanded portion 41a having a diameter larger than that of a front hole portion. When the panel 4 is in the locked state, the gasket 25 of the socket 2 is fitted in the diameter-expanded portion 41a, and the insertion port 20 has a front end (forward end) flush with the front end of the open hole 41 (that is, the front plate surface of the plate section 40). Fitting the gasket 25 of the socket 2 in the diameter-expanded portion 41a prevents passage of water between the gasket 25 and the inner circumferential surface of the diameter-expanded portion 41a (that is, entry of water from the outside).

When the panel 4 is in the locked state, the pair of ribs 70c of the support 7 on the housing 3 are fitted in the pair of grooves 45 in the plate section 40 loosely (that is, with a gap therebetween). This prevents the panel 4 from wobbling when the panel 4 becomes embedded and fixed with the sealing section 9 (described later), and thereby improves the accuracy in the fixation.

The LED 5 is a so-called shell-shaped LED element including (i) a shell-shaped light-emitting section 50 including a light-emitting element and a light-transmitting resin embedding the light-emitting element and (ii) LED pins 51 in the form of a pair of terminal pins protruding from the light-emitting section 50. The LED 5 is positioned such that the LED pins 51 are inserted in the second through holes T and soldered to the substrate 1 for electric connection and that the light-emitting section 50 is contained in the light-guiding seat section 6 described later. The LED 5 is an indicator configured to emit light and stop the light emission to indicate, for example, whether the repeater 100 is on or off.

Figure 8:
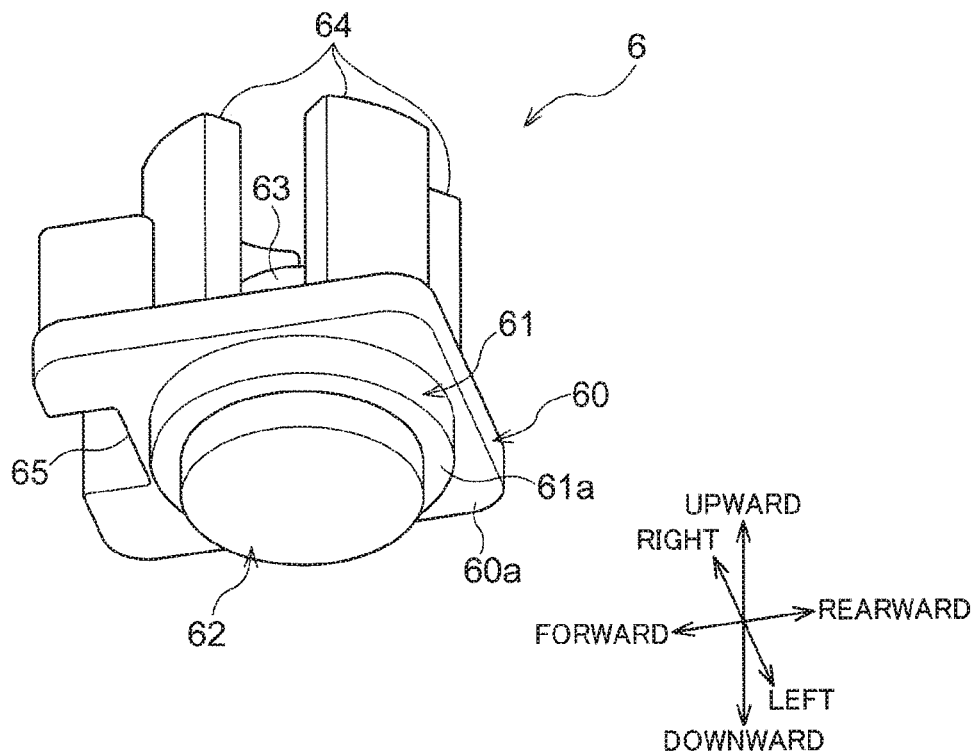
FIG. 8 is a perspective view of a light-guiding seat section as viewed obliquely from a back, lower right position.

The light-guiding seat section 6 is, as illustrated in FIG. 8, a supportive seat for the LED 5 which is made of a light-transmitting resin (for example, a polycarbonate) and which guides light of the LED 5 to the outside of the housing 3. The light-guiding seat section 6 is also a light-guiding window fitted in the window section W. The light-guiding seat section 6 includes (i) a light-guiding seat section main body 60 supporting the LED 5 and (ii) a plurality of pillar-shaped contact sections 64 (which are an example of the "pillar sections") standing on (that is, protruding upwardly in the up-down direction from) the upper surface of the light-guiding seat section main body 60.

The light-guiding seat section main body 60 has a rectangular cross section as viewed in the up-down direction. The light-guiding seat section main body 60 includes (i) a bulge section 61 in the form of a projection resulting from a bulge of a central portion of a plate surface 60a (which is an example of the "plate surface section") of the light-guiding seat section main body 60, the plate surface 60a being the lower surface of the light-guiding seat section main body 60, (ii) an exposure portion 62 in the form of a projection resulting from a further bulge of a central portion of a plate surface 61a (which is another example of the "plate surface section") of the bulge section 61, the plate surface 61a being the lower surface of the bulge section 61, (iii) a container section 63 present on the upper surface side of the light-guiding seat section main body 60, and (iv) a pair of cutout sections 65 each in the form of a rectangular inward hollow. The light-guiding seat section main body 60 for the present embodiment is arranged such that two adjacent sides thereof each have a cutout section 65. Fitting the ribs 38 on the second housing walls 32 into the respective hollows of the pair of cutout sections 65 allows the light-guiding seat section 6 to be positioned in the left-right direction and the front-back direction.

The bulge section 61 and the exposure portion 62 each have a circular cross section as viewed in the up-down direction. As viewed from the side of the lower surface of the exposure portion 62, the plate surface 61a and the plate surface 60a are in the form of a step section extending radially outwardly from the exposure section 62 as the center in the order from the plate surface 61*a* to the plate surface 60*a*.

Fitting the exposure portion 62 in the window hole 39 causes (i) the bulge section 61 to be fitted in the second depression 37 and (ii) the light-guiding seat section main body 60 to be fitted in the first depression 36. During this operation, the plate surface 61*a* comes into surface contact with the bottom surface 37*a* (which is an example of the area around the window hole 39) to achieve hermetic contact, and the plate surface 60*a* comes into surface contact with the bottom surface 36*a* (which is an example of the area around the window hole 39) to achieve hermetic contact.

Figure 9:
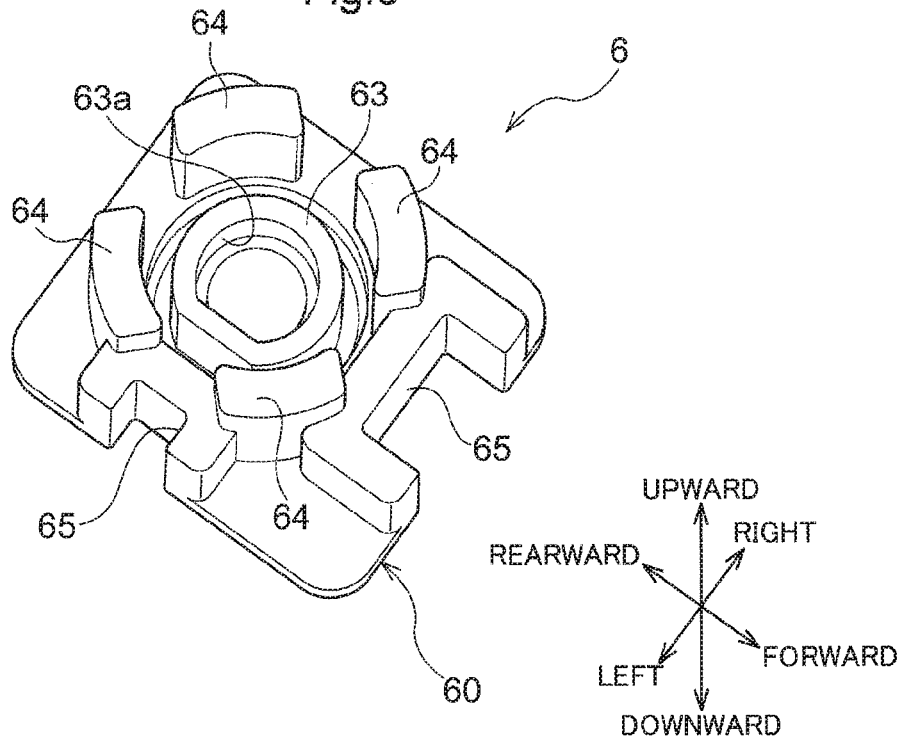
FIG. 9 is a perspective view of a light-guiding seat section as viewed obliquely from a front, upper left position.

The container section 63 is a cylindrical structure present on the upper surface side of the light-guiding seat section main body 60 and extending in the up-down direction. The container section 63 coincides with the exposure portion 62 as viewed in the up-down direction. As illustrated in FIG. 9, the cylindrical container section 63 has a depression 63*a* inside in which the light-emitting section 50 is fitted loosely. The container section 63 receives the light-emitting section 50 in the depression 63*a* and supports the LED 5 in the state where the LED pins 51 protrudes upwardly.

The contact sections 64 are, as illustrated in FIGS. 8 and 9, a plurality of (four) pillar-shaped structures that protrude upwardly in the up-down direction from the upper surface of the light-guiding seat section main body 60 and that are each present outwardly of the container section 63 in a radial direction and that are arranged along the periphery of the container section 63.

Figure 10:
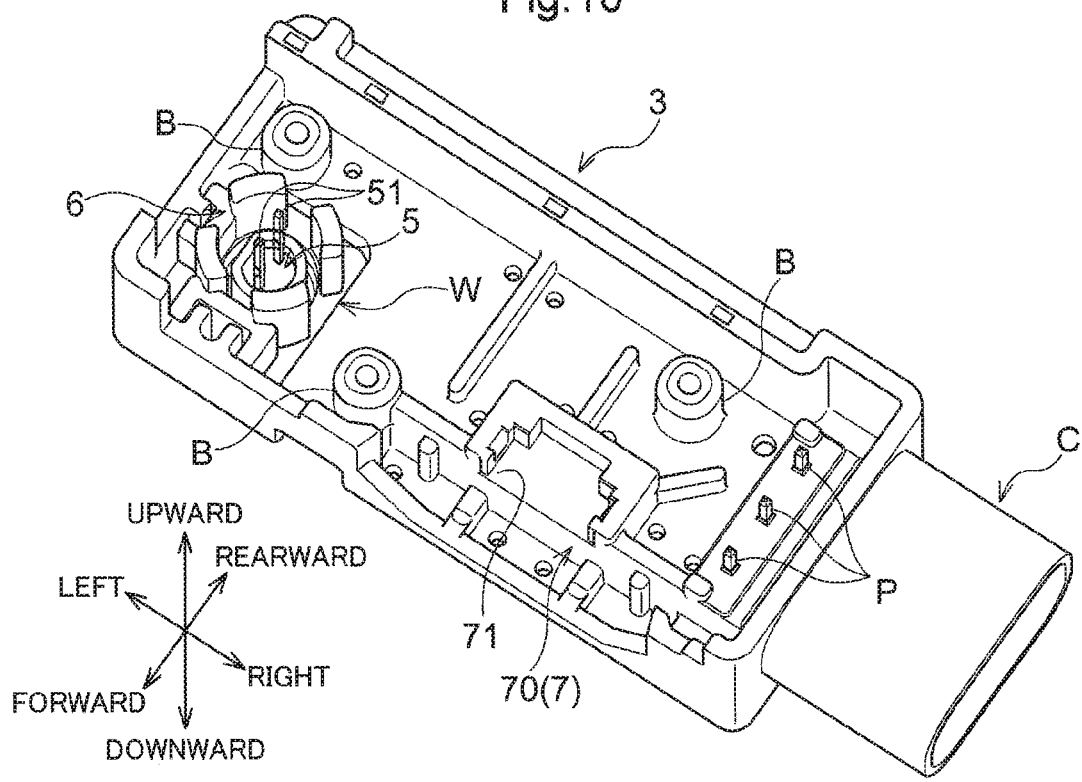
FIG. 10 is an explanatory diagram illustrating a state where a light-guiding seat section supporting an LED is fitted in a housing.
Figure 16:
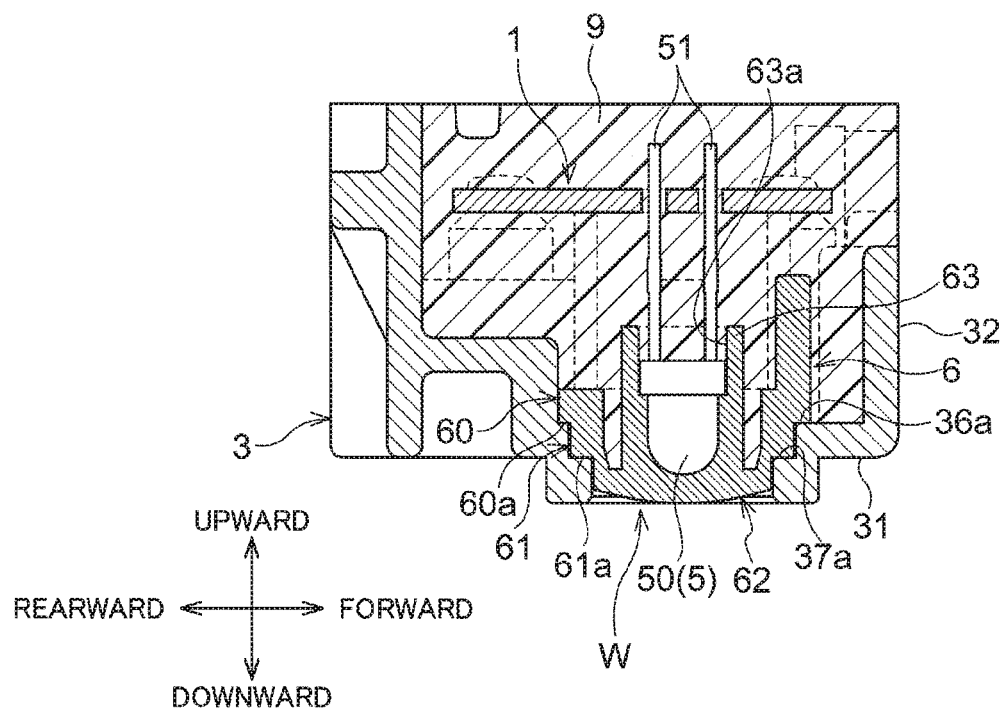
FIG. 16 is a cross-sectional view taken along line XVI-XVI in FIG. 14, illustrating a sealed state.

Fitting the light-guiding seat section 6 in the window section W as illustrated in FIG. 10 causes the lower surface of the exposure portion 62 to be exposed to the outside of the housing 3 (see FIGS. 2 and 16). This allows light of the LED 5 to be guided to the outside of the housing 3. Fitting the light-guiding seat section 6 in the window section W and placing the substrate 1 in the housing 3 in the state where the LED 5 is contained in the housing 3 causes contact between the respective upper end surfaces of the contact sections 64 and the lower surface of the substrate 1. This causes the light-guiding seat section 6 to be sandwiched and fixed between the substrate 1 and the housing 3. In this state, the contact sections 64 and the housing 3 are apart from each other.

[Description of Assembly Method]

The description below deals with a method for assembling the repeater 100.

First, the light-guiding seat section 6 is fitted into the window section W of the housing 3, and the LED 5 is contained in the light-guiding seat section 6. This causes the LED pins 51 to be supported by the housing 3 via the light-guiding seat section 6 and protrude upwardly (see FIG. 10). Then, the substrate 1 is contained in the housing 3 in the state where the first through holes S of the substrate 1, the socket 2, and the second through holes T of the substrate 1 coincide respectively with the pins P of the housing 3, the supportive depression 71 of the housing 3, and the LED pins 51 in the up-down direction. This causes the pins P to be inserted in the first through holes S, allows the supportive depression 71 to support the socket 2, and causes the LED pins 51 to be inserted in the second through holes T (see FIG. 11). The above operation also causes the light-guiding seat section 6 (see FIG. 8) to be sandwiched and (tentatively) fixed between the housing 3 and the substrate 1 (see FIGS. 3 and 12).

Then, the substrate 1 is fixed to the bosses B of the housing 3 with use of the screws N. Further, the first through holes S and the pins P are electrically connected to each other by soldering or the like to be fixed. Similarly, the second through holes T and the LED pins 51 are electrically connected to each other by soldering or the like to be fixed.

Figure 11:
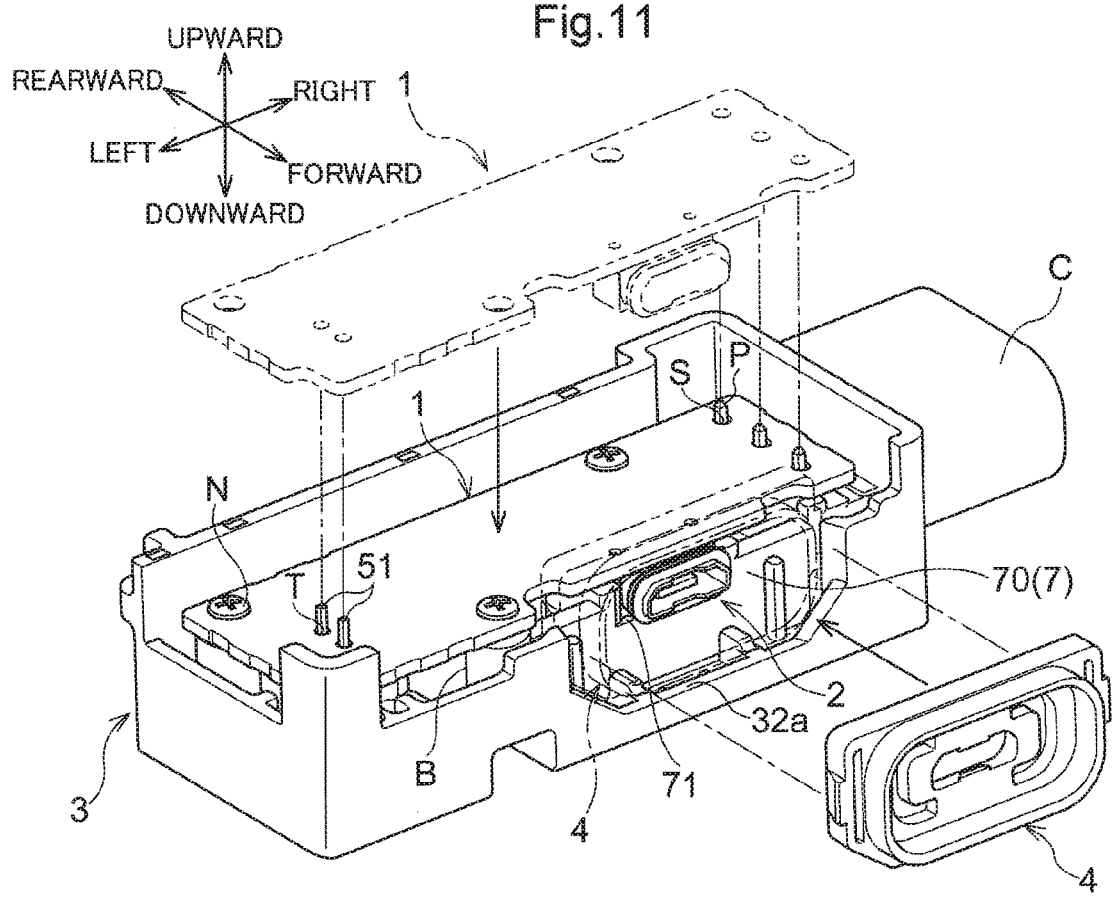
FIG. 11 is an explanatory diagram illustrating how a substrate, a housing, and a design panel are assembled.

Then, the panel 4 is attached to the housing 3 in a snap-fit manner while the socket 2 is fitted in the open hole 41 of the panel 4, so that the panel 4 is in the locked state (see FIG. 11).

After the panel 4 has been locked, melted resin or resin precursor as a sealer is injected into the area surrounded by the substrate 1, the housing 3, and the panel 4 and is cured to seal the area. Then, the area on the substrate 1 and the area around the periphery of the outer frame 44 of the panel 4 are sealed with the sealer. As a result, the sealing section 9 is formed. This causes the substrate 1 to be embedded in or sealed by the sealing section 9 and fixed by the sealing section 9. The panel 4 is fixed in such a manner that only an outer portion of the plate section 40 as viewed from the side of the outer frame 44 is embedded in the sealing section 9 (see FIGS. 1 and 2). The light-guiding seat section 6 is similarly embedded in or sealed by the sealing section 9 and fixed by the sealing section 9. This allows the above members to be integrated with each other as a waterproof repeater 100.

The panel 4 is, as described above, fixed such that only the area around the periphery of the outer frame 44 is embedded in the sealing section 9. The panel 4 thus has a surface (front surface) on the side of the inner circumference of the outer frame 44 which surface is exposed to the outside of the repeater 100. This allows the user to directly see the design provided on that portion of the panel 4 which is on the side of the inner circumference of the outer frame 44, and maintains the good appearance of the area around the connector.

The sealing section 9 is preferably formed through a hot melt process, that is, by (i) placing the housing 3 containing members such as the substrate 1 in a sealing mold (not shown in the drawings) having an inner wall surface with an inverted shape of the sealing section 9 and (ii) injecting the sealer. The sealing section 9 may alternatively be formed through a potting process.

[Description of Sealed State]

Forming the sealing section 9 as described above allows the repeater 100 to be waterproof.

Figure 12:
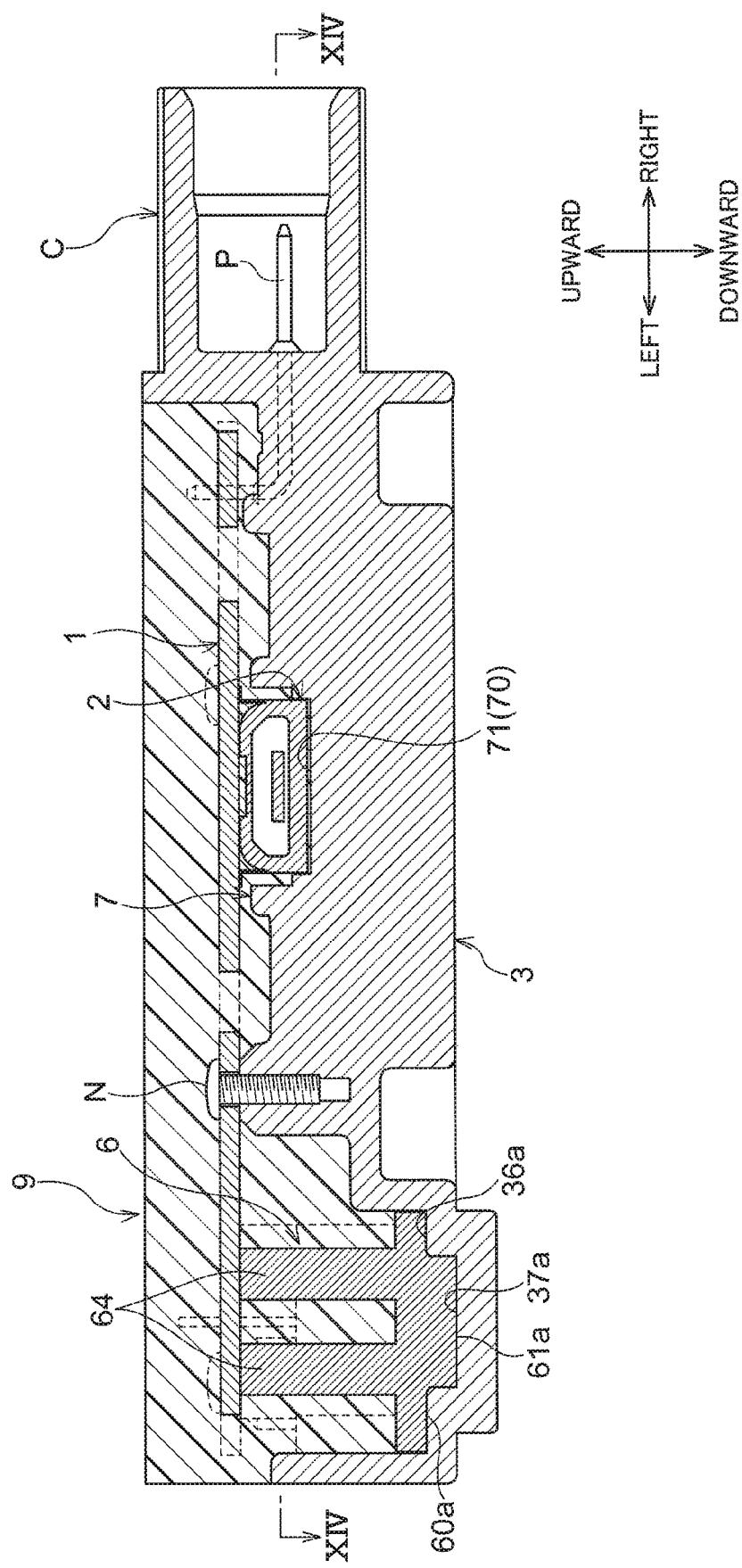
FIG. 12 is a cross-sectional view taken along line XII-XII in FIG. 1, illustrating a sealed state.
Figure 13:
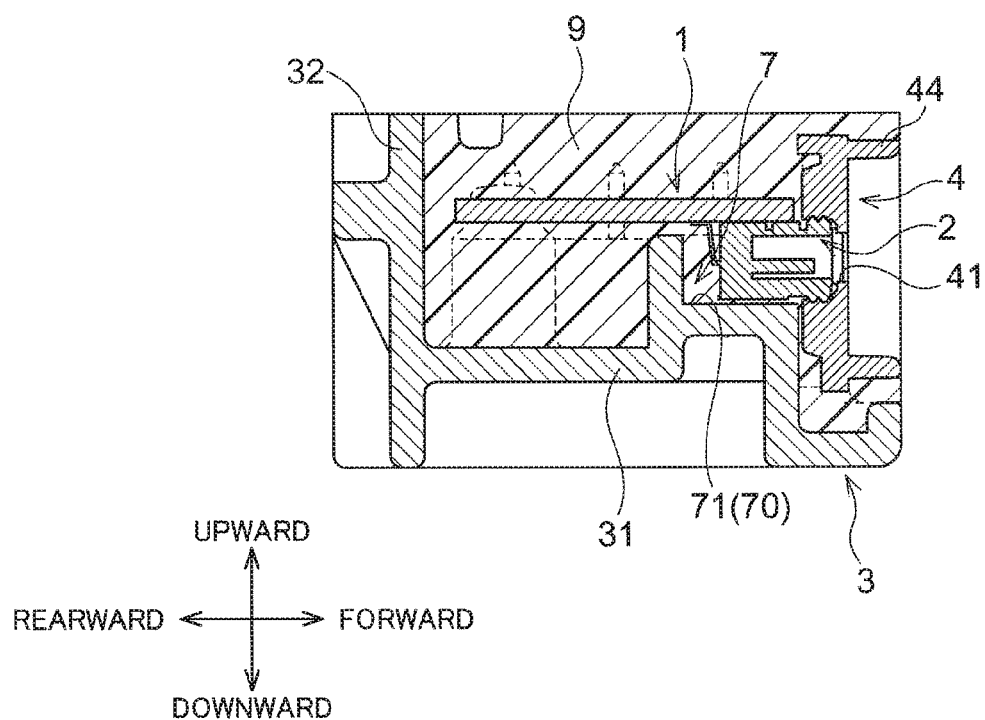
FIG. 13 is a cross-sectional view taken along line XIII-XIII in FIG. 1, illustrating a sealed state.
Figure 14:
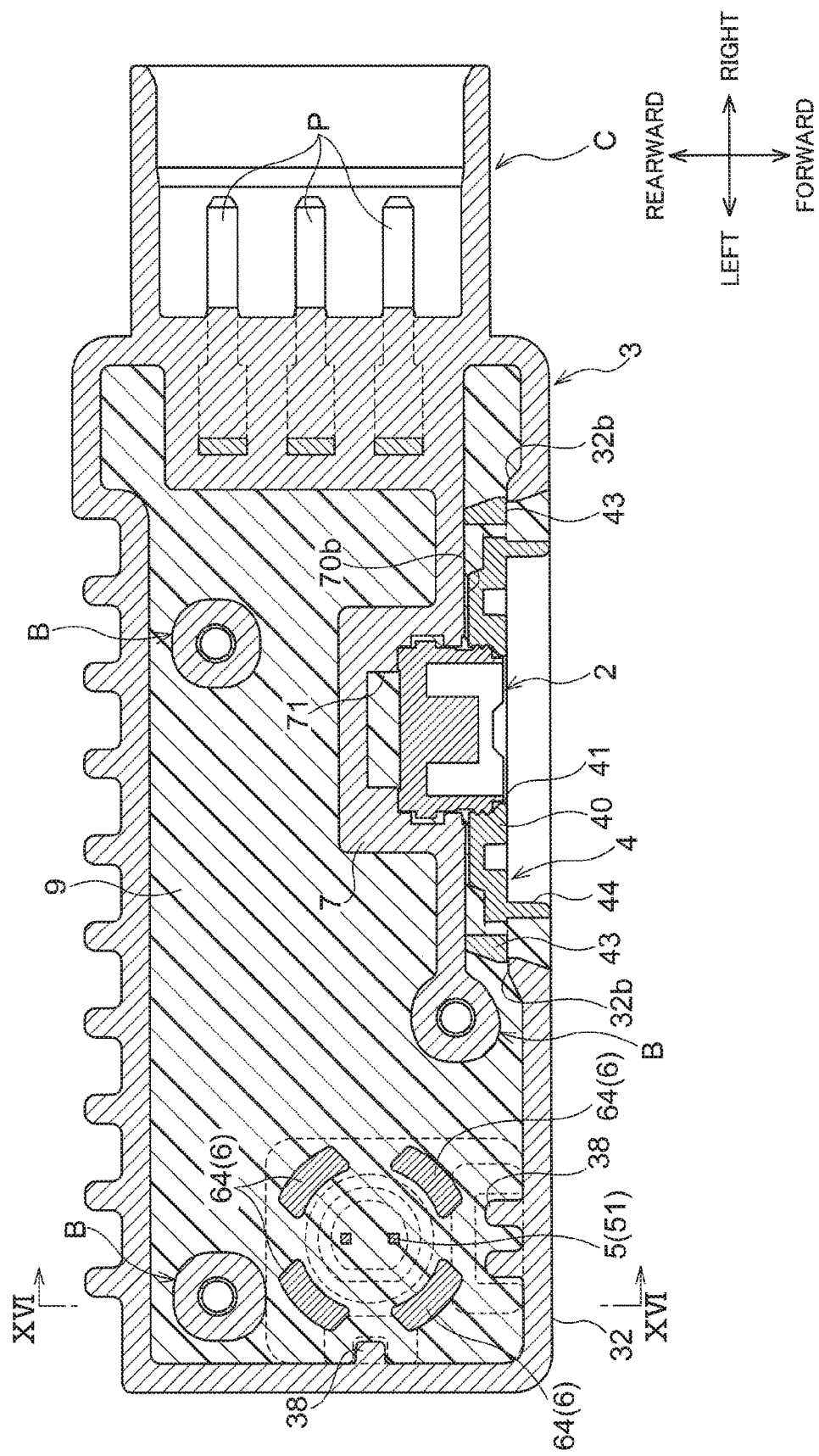
FIG. 14 is a cross-sectional view taken along line XIV-XIV in FIG. 12, illustrating a sealed state.

As illustrated in FIGS. 12, 13, and 14, the area adjacent to the periphery of the socket 2 is sealed with the sealer of the sealing section 9. This causes the area adjacent to the periphery of the socket 2 to be waterproof.

Figure 15:
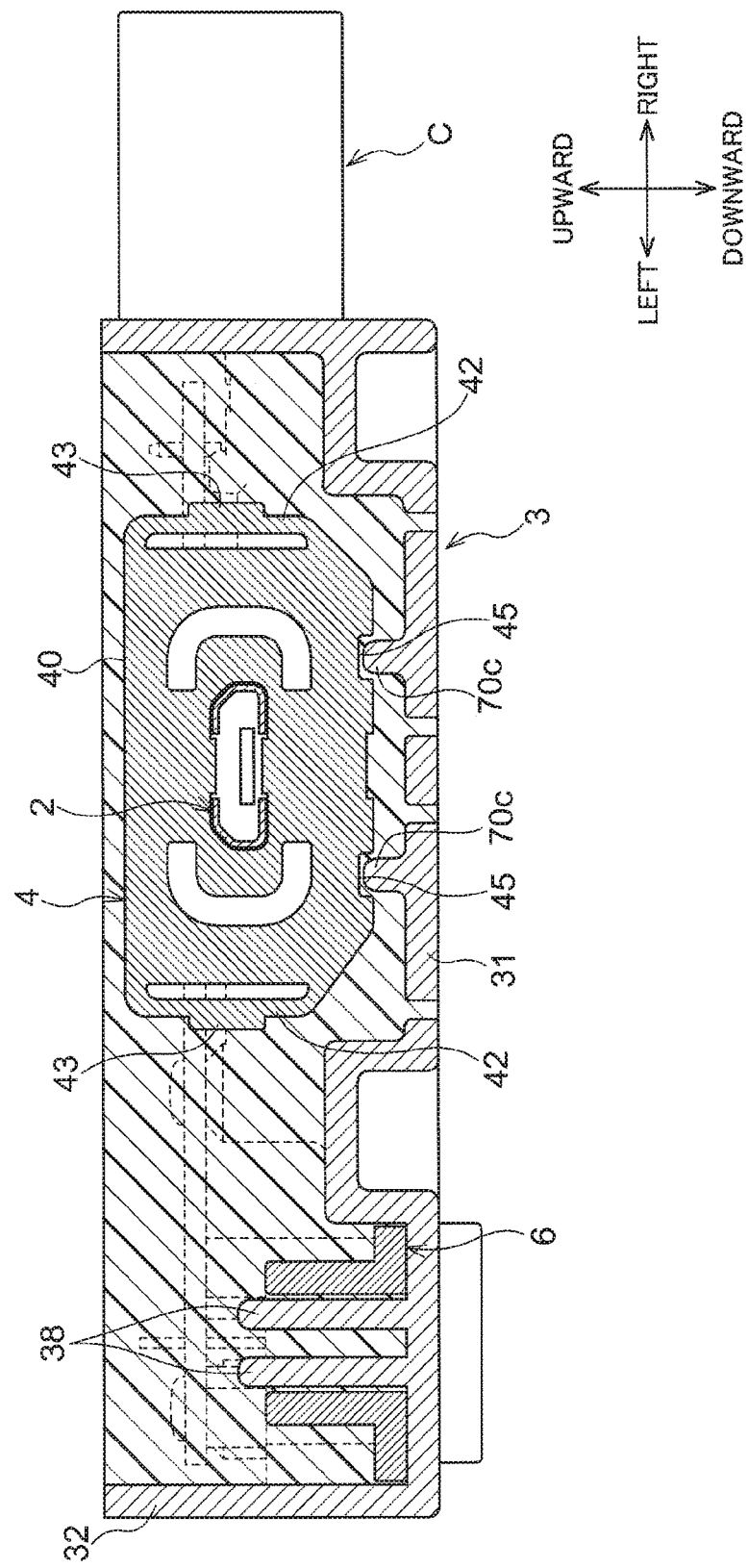
FIG. 15 is a cross-sectional view taken along line XV-XV in FIG. 1, illustrating a sealed state.

As illustrated in FIG. 14, the area between the panel 4, the sealing wall 70*b* of the housing 3, and the socket 2 and the area between the panel 4 and the cutout section 32*a* of the housing 3 are sealed with the sealer of the sealing section 9. As illustrated in FIG. 15, the entire area around the periphery of the panel 4 is sealed with the sealer of the sealing section 9. This causes the area between the housing 3, the panel 4, and the socket 2 to be waterproof.

As illustrated in FIG. 16, the area between the light-guiding seat section 6 and the housing 3 is sealed with the sealer of the sealing section 9 in the state where the plate surface 60*a* and plate surface 61*a*, for example, of the light-guiding seat section 6 are in surface contact with the bottom surface 36*a* and bottom surface 37*a*, for example, of the window section W. Bringing the plate surface 60*a* and plate surface 61*a*, for example, of the light-guiding seat section 6 into surface contact with the bottom surface 36*a* and bottom surface 37*a*, for example, of the window section W as such prevents the sealer from leaking during the sealing operation and allows improved waterproofness after the sealing operation (that is, after the sealing section 9 is formed).

Since the bosses B and the contact sections 64 are sufficiently apart from the second housing walls 32 as illustrated in FIG. 14, the space between (i) the bosses B and the contact sections 64 and (ii) the housing 3 is filled with the sealer of the sealing section 9 with no void or air bubble.

The above description makes it possible to provide (i) a waterproof electronic component having a good appearance around a connector and having good waterproofness and (ii) a method for assembling the waterproof electronic component.

Other Embodiments (1) The embodiment described above is an example case in which the surface of the supportive depression 71 includes (i) first supportive wall sections 71s (that is, the left and right side walls of the supportive depression 71), (ii) a second supportive wall section 71b (that is, the back wall of the supportive depression 71), and (iii) a third supportive wall section 71a (that is, the lower wall of the supportive depression 71). It is, however, sufficient for the supportive depression 71 to have, as a surface thereof, only at least one of the first supportive wall sections 71s, the second supportive wall section 71b, and the third supportive wall section 71a. In particular, the supportive depression 71 does not necessarily have first supportive wall sections 71s on both the front and back sides, and may have only one first supportive wall section 71s on either of the front and back sides.

(2) The embodiment described above is an example arrangement in which the panel 4 becomes attached to the housing 3 in a snap-fit manner into a locked state. The panel 4 may become locked by another method. The panel 4 may, for instance, become screwed to the housing 3 into a locked state.

(3) The embodiment described above is an example arrangement in which the bosses B are sufficiently apart from the second housing walls 32. The bosses B may, however, be adjacent to the second housing walls 32 or integrated with the second housing walls 32.

(4) The embodiment described above is an example arrangement in which the contact sections 64 are sufficiently apart from the second housing walls 32. The contact sections 64 may, however, be adjacent to, be in contact with, or abut the second housing walls 32.

(5) The embodiment described above is an example case in which (i) the light-guiding seat section main body 60 has, for example, a plate surface 61a and a plate surface 60a and (ii) as viewed from the side of the lower surface of the exposure portion 62, the plate surface 61a and the plate surface 60a are in the form of a step section extending radially outwardly from the exposure section 62 as the center in the order from the plate surface 61a to the plate surface 60a. The embodiment described above is also an example case in which the plate surface 61a is in surface contact with the bottom surface 37a of the first housing wall 31 for hermetic contact and in which the plate surface 60a is in surface contact with the bottom surface 36a of the first housing wall 31 for hermetic contact. The light-guiding seat section main body 60 does not, however, necessarily have a plate surface 61a and a plate surface 60a as the step section. An alternative example is that the first housing wall 31 has a mortar-shaped inclined surface around the window hole 39, that the light-guiding seat section main body 60 has an inclined surface matching the above inclined surface, and that the two inclined surfaces are in surface contact with each other. Another alternative example is that simply the lower surface of the light-guiding seat section main body 60 and the upper surface of that portion of the first housing wall 31 which is present around the window hole 39 are in surface contact with each other.

(6) The embodiment described above is a case involving a plug C. The plug C is, however, not necessarily included. The embodiment may alternatively include, instead of the plug C, (i) a socket to which the second end of each pin P is electrically connected, (ii) a cable serving as a signal line, or (iii) another electronic substrate.

(7) The embodiment described above is a case where the sealing section 9 is made of a sealer. Alternatively, a portion of the sealing section 9 may be replaced with a second housing other than the housing 3.

(8) The embodiment described above is an example case in which the contact points on the side of the substrate 1 for electric connection to an external terminal or electronic component to be mounted on the substrate 1 are through holes (namely, the first through holes S and the second through holes T) each including (i) an open hole present through the board surfaces of the substrate 1, the open hole having an inner wall provided with an electrode, and (ii) a land as an electrode present in a region on a surface of the substrate 1 which region surrounds the open hole. The embodiment described above is also an example case in which the respective terminal pins (namely, the pins P and the LED pins 51) of the external terminal and electronic component to be mounted on the substrate 1 are inserted in the through holes for electric connection. The contact points on the side of the substrate 1 are, however, not limited to such through holes. Further, the electric connection to the contact points on the side of the substrate 1 are not necessarily achieved by the insertion of the terminal pins into the through holes. An alternative example is that instead of inserting the terminal pins into the through holes, a land is simply present on the premise that (i) the terminal pins each become surface-mounted (for example, soldered to the land) or that (ii) the terminal pins each become pressed against the land as a spring terminal for connection.

(9) The embodiment described above is an example case in which the through holes (namely, the first through holes S and the second through holes T) and the terminal pins (namely, the pins P and the LED pins 51) are soldered to each other for electric connection to be fixed. The terminal pins may, however, be each in the form of an elastic contact such as a press-fit terminal to be simply pressed against the inner wall of a through hole for connection.

The arrangements disclosed in the above embodiments (including the above other embodiments; hereinafter the same) may each be combined for an application with an arrangement disclosed in another embodiment, as long as such a combination does not cause an inconvenience. The embodiments disclosed in the present specification are mere examples. Embodiments of this disclosure are not limited to those embodiments. This disclosure may be altered as appropriate, as long as such an alteration does not result in a failure to attain an object of this disclosure.

INDUSTRIAL APPLICABILITY

This disclosure is applicable to a waterproof electronic component.

REFERENCE SIGNS LIST

1 Substrate
2 Socket (first connector)

3 Housing
4 Panel
5 LED
6 Light-guiding seat section
7 Support
9 Sealing section
20 Insertion port
22 Fixation portion
31 First housing wall
32 Second housing wall
39 Window hole (second open hole)
40 Plate section
41 Open hole (first open hole)
51 LED pin (terminal pin)
53 Container section
60 Light-guiding seat section main body
60*a* Plate surface (plate surface section)
61*a* Plate surface (plate surface section)
62 Exposure portion
63*a* Depression
64 Contact section (pillar section)
70*b* Sealing wall
71 Supportive depression (supportive wall section)
71*a* Third supportive wall section
71*b* Second supportive wall section
71*s* First supportive wall section
100 Repeater (waterproof electronic component)
A Main body
B Boss (seat section)
C Plug (second connector)
P Pin (terminal pin)
S First through hole (contact point)
T Second through hole (contact point)
W Window section
b Seating surface

The invention claimed is:

1. A waterproof electronic component, comprising:
an electronic substrate including a contact point for electric connection;
a first connector including (i) an insertion port into which a plug is inserted and out of which the plug is pulled and (ii) a fixation portion mounted on and fixed to a surface of the electronic substrate;
a housing containing the electronic substrate;
a terminal pin held by the housing and having a first end electrically connected to the electronic substrate via the contact point; and
a sealing section including a resin with which an area surrounded by the electronic substrate and the housing is filled, wherein
the insertion port is present outside a peripheral edge of the electronic substrate and faces outwardly in such a manner that a direction of the insertion and pulling is along a board surface of the electronic substrate,
the housing includes:
a seat section having a seating surface on which the electronic substrate is placed; and
a support including a supportive wall section capable of supporting the fixation portion of the first connector,
the electronic substrate is placed on the seat section in a state where the surface of the electronic substrate faces the seating surface,
the first connector is oriented in such a manner that at least a portion of an outer surface of the fixation portion is close to and faces the supportive wall section,
the waterproof electronic component, further comprises:
a design panel including a plate section having an open hole in which the first connector is fitted, the design panel having a periphery partially covered by the housing,
the support includes a sealing wall standing in a direction crossing the seating surface, the sealing wall extending in such a manner as to partially cover the outer surface of the fixation portion of the first connector, and
the design panel is partially embedded in the sealing section and is fixed to the housing in a state where the plate section has a plate surface facing a wall surface of the sealing wall.

2. The waterproof electronic component according to claim 1, wherein
the supportive wall section includes two first supportive wall sections close to and facing two respective side end faces included in the outer surface of the fixation portion, the side end faces being parallel to the direction of the insertion and pulling and perpendicular to the board surface of the electronic substrate.

3. The waterproof electronic component according to claim 1, wherein
the supportive wall section includes a second supportive wall section close to and facing a back end surface included in the outer surface of the fixation portion, the back end surface being perpendicular to the direction of the insertion and pulling and opposite to the insertion port.

4. The waterproof electronic component according to claim 1, wherein
the supportive wall section includes a third supportive wall section close to and facing an opposite surface included in the outer surface of the fixation portion, the opposite surface being parallel to the direction of the insertion and pulling and opposite to that surface of the fixation portion which faces the electronic substrate.

5. The waterproof electronic component according to claim 1, wherein
the design panel and the housing are connected with each other in a snap-fit manner.

6. The waterproof electronic component according to claim 1, wherein
the electronic substrate is entirely contained in a space surrounded by the housing, the design panel, and the sealing section.

7. The waterproof electronic component according to claim 1, wherein the housing includes:
a first housing wall along the electronic substrate; and
a second housing wall standing on a peripheral portion of the first housing wall, wherein
the seat section is in a form of a pillar that is apart from the second housing wall and that protrudes from a surface of the first housing wall in a direction in which the second housing wall stands, and
the seating surface is an end surface of the seat section in the form of the pillar.

8. The waterproof electronic component according to claim 1, further comprising:
a second connector including (i) a frame body capable of becoming fitted with an external connector and (ii) an external terminal, which is a second end of the terminal pin, present in a space surrounded by the frame body, wherein
the terminal pin has an intermediate portion fixed to the housing through insert molding, and
the frame body is integrated with the housing.

9. A method for assembling the waterproof electronic component according to claim 1, the method comprising:
placing the electronic substrate, on which the first connector is mounted and to which the first connector is fixed, into the housing while keeping the first end of the terminal pin, fixed to the housing through insert molding, in electric connection with the contact point;
then fitting the first connector into the open hole of the design panel such that the design panel and the housing become connected with each other in a snap-fit manner; and
then injecting the sealer into an area surrounded by the electronic substrate, the housing, and the design panel to form the sealing section.

10. The method according to claim 9, wherein
the electronic substrate is embedded in the sealer for the formation of the sealing section.

11. A waterproof electronic component, comprising:
an electronic substrate including a contact point for electric connection;
a housing including a first housing wall along the electronic substrate and containing the electronic substrate;
a light-emitting diode present between the electronic substrate and the housing and including (i) a light-emitting section including a light-emitting element and (ii) a terminal pin protruding from the light-emitting section;
a light-guiding seat section configured to guide light of the light-emitting section to outside of the housing; and
a sealing section including a resin with which an area surrounded by the electronic substrate and the housing is filled, wherein
the first housing wall includes:
a seat section having a seating surface on which the electronic substrate is placed; and
a window section in which the light-guiding seat section is fitted and which has an open hole,
the light-emitting diode is oriented such that the light-emitting section is supported by the light-guiding seat section in a state where a first end of the terminal pin protrudes in a direction crossing the seating surface,
the electronic substrate is present on the seat section in a state where the first end of the terminal pin is connected to the contact point,
the light-guiding seat section includes:
a light-guiding seat section main body having a depression in which the light-emitting section is fitted and which supports the light-emitting section;
a plate surface section present at a peripheral portion of the light-guiding seat section main body and in surface contact with an area around the open hole; and
a contact section protruding from the light-guiding seat section main body in a direction crossing the seating surface and present in contact with the electronic substrate,
the light-guiding seat section is sandwiched between and held by the first housing wall and the electronic substrate by means of the plate surface section and the contact section,
the contact section includes a plurality of pillar sections each protruding from a position along a periphery of the depression, and
the plurality of pillar sections are arranged in a ring-shaped pattern around the periphery of the depression.

12. The waterproof electronic component according to claim 11, wherein
the light-guiding seat section further includes an exposure portion fitted in the open hole and exposed to the outside of the housing, and
the plate surface section is in a form of a step section extending outwardly radially from a periphery of the exposure portion.

13. The waterproof electronic component according to claim 11, wherein
the housing includes a second housing wall standing on a peripheral portion of the first housing wall, and
the contact section is in a form of a pillar that is apart from the second housing wall and that protrudes in a direction in which the second housing wall stands.

14. A method for assembling the waterproof electronic component according to claim 11, the method comprising:
fitting the light-guiding seat section into the window section and allowing the light-guiding seat section to support the light-emitting section of the light-emitting diode such that the first end of the terminal pin protrudes in the direction crossing the seating surface;
then placing the electronic substrate into the housing while keeping the first end of the terminal pin in connection to the contact point, and
then injecting a sealer into the area surrounded by the electronic substrate and the housing to form the sealing section.

15. The method according to claim 14, wherein
the electronic substrate is embedded in the sealer for the formation of the sealing section.

* * * * *